(12) United States Patent
Wu et al.

(10) Patent No.: US 9,917,165 B2
(45) Date of Patent: Mar. 13, 2018

(54) MEMORY CELL STRUCTURE FOR IMPROVING ERASE SPEED

(71) Applicant: Taiwan Semiconductor Manufacturing Co., Ltd., Hsin-Chu (TW)

(72) Inventors: Chang-Ming Wu, New Taipei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 34 days.

(21) Appl. No.: 14/713,462

(22) Filed: May 15, 2015

(65) Prior Publication Data

US 2016/0336415 A1    Nov. 17, 2016

(51) Int. Cl.
| | |
|---|---|
| *H01L 29/788* | (2006.01) |
| *H01L 29/792* | (2006.01) |
| *H01L 29/423* | (2006.01) |
| *H01L 29/66* | (2006.01) |
| *H01L 21/28* | (2006.01) |
| *H01L 27/11524* | (2017.01) |
| *H01L 21/8239* | (2006.01) |

(52) U.S. Cl.
CPC .. *H01L 29/42328* (2013.01); *H01L 21/28273* (2013.01); *H01L 27/11524* (2013.01); *H01L 29/66825* (2013.01); *H01L 29/788* (2013.01)

(58) Field of Classification Search
CPC ............. H01L 27/11517–27/11597; H01L 29/42328–29/42352; H01L 29/66825; H01L 29/788; H01L 29/7883
See application file for complete search history.

(56) References Cited

U.S. PATENT DOCUMENTS

| | | | | |
|---|---|---|---|---|
| 5,953,611 A | * | 9/1999 | Tanaka | H01L 27/115 257/E21.682 |
| 6,108,242 A | * | 8/2000 | Lin | H01L 27/11521 257/E21.682 |
| 6,242,308 B1 | * | 6/2001 | Hsieh | H01L 27/115 257/E21.682 |
| 6,339,015 B1 | | 1/2002 | Bracchitta et al. | |
| 6,426,257 B1 | | 7/2002 | Kanamori | |

(Continued)

OTHER PUBLICATIONS

Notice of Allowance dated Mar. 15, 2016 U.S. Appl. No. 14/713,462.

(Continued)

*Primary Examiner* — Maliheh Malek
(74) *Attorney, Agent, or Firm* — Eschweiler & Potashnik, LLC

(57) ABSTRACT

A split-gate flash memory cell for improved erase speed is provided. An erase gate and a floating gate are laterally spaced over a semiconductor substrate. The floating gate has a height increasing towards the erase gate, a concave sidewall surface neighboring the erase gate, and a tip defined an interface of the concave sidewall surface and an upper surface of the floating gate. A control gate and a sidewall spacer are arranged over the upper surface of the floating gate. The control gate is laterally offset from the tip of the floating gate, and the sidewall spacer is laterally arranged between the control gate and the tip. A method for manufacturing the split-gate flash memory cell is also provided.

20 Claims, 14 Drawing Sheets

(56) References Cited

U.S. PATENT DOCUMENTS

| | | | | |
|---|---|---|---|---|
| 6,525,369 B1* | 2/2003 | Wu | H01L 27/115 | 257/314 |
| 6,709,925 B1* | 3/2004 | Choi | H01L 21/28273 | 257/E21.209 |
| 6,723,604 B2 | 4/2004 | Yuan et al. | | |
| 7,002,200 B2* | 2/2006 | Hsieh | H01L 27/11521 | 257/296 |
| 7,271,061 B2* | 9/2007 | Jeon | H01L 27/115 | 257/E21.682 |
| 7,358,134 B2* | 4/2008 | Wu | H01L 27/115 | 257/E21.179 |
| 7,492,002 B2* | 2/2009 | Jeon | G11C 16/0425 | 257/316 |
| 7,718,488 B2* | 5/2010 | Chen | G11C 16/0425 | 257/E21.68 |
| 7,928,499 B2* | 4/2011 | Liu | H01L 21/28273 | 257/321 |
| 8,008,702 B2* | 8/2011 | Wang | H01L 27/11521 | 257/314 |
| 8,114,740 B2* | 2/2012 | Liu | H01L 21/28273 | 257/E21.158 |
| 8,273,625 B2* | 9/2012 | Shen | H01L 21/28273 | 257/316 |
| 8,669,607 B1* | 3/2014 | Tsair | H01L 29/7881 | 257/316 |
| 8,780,628 B2* | 7/2014 | Lin | H01L 29/94 | 365/185.05 |
| 8,890,232 B2* | 11/2014 | Tsair | H01L 29/7881 | 257/316 |
| 8,946,806 B2* | 2/2015 | Tan | H01L 27/11521 | 257/314 |
| 9,076,681 B2* | 7/2015 | Wu | H01L 29/42328 | |
| 9,082,651 B2* | 7/2015 | Wu | H01L 27/11517 | |
| 9,159,735 B2* | 10/2015 | Tsair | H01L 29/788 | |
| 9,159,842 B1* | 10/2015 | Wu | H01L 29/66825 | |
| 9,190,532 B2* | 11/2015 | Wang | H01L 21/28273 | |
| 9,245,638 B2* | 1/2016 | Do | G11C 16/0433 | |
| 9,257,571 B1* | 2/2016 | Tseng | H01L 29/792 | |
| 9,287,282 B2* | 3/2016 | Hsieh | H01L 27/11524 | |
| 9,343,465 B2* | 5/2016 | Chu | H01L 29/7883 | |
| 9,356,142 B2* | 5/2016 | Chang | H01L 29/7831 | |
| 9,391,151 B2* | 7/2016 | Wu | H01L 29/42328 | |
| 9,425,206 B2* | 8/2016 | Chuang | H01L 27/092 | |
| 9,431,257 B2* | 8/2016 | Liu | H01L 27/1157 | |
| 9,484,352 B2* | 11/2016 | Chuang | H01L 27/11541 | |
| 9,543,153 B2* | 1/2017 | Chuang | H01L 27/11573 | |
| 9,559,177 B2* | 1/2017 | Wu | H01L 29/42344 | |
| 9,614,048 B2* | 4/2017 | Wu | H01L 29/42368 | |
| 9,728,545 B2* | 8/2017 | Wu | H01L 27/11548 | |
| 2003/0057505 A1* | 3/2003 | Ebina | H01L 27/105 | 257/411 |
| 2004/0065917 A1* | 4/2004 | Fan | H01L 27/11521 | 257/315 |
| 2004/0087084 A1* | 5/2004 | Hsieh | H01L 27/11521 | 438/257 |
| 2004/0256657 A1* | 12/2004 | Hung | H01L 27/115 | 257/315 |
| 2005/0082601 A1* | 4/2005 | Chu | H01L 27/115 | 257/321 |
| 2007/0093024 A1* | 4/2007 | Fu | H01L 21/28273 | 438/257 |
| 2008/0217675 A1* | 9/2008 | Liu | H01L 21/28273 | 257/321 |
| 2008/0248620 A1* | 10/2008 | Liu | H01L 21/28273 | 438/257 |
| 2008/0268592 A1* | 10/2008 | Park | H01L 21/28273 | 438/253 |
| 2008/0308858 A1 | 12/2008 | Sandhu et al. | | |
| 2009/0039410 A1* | 2/2009 | Liu | H01L 21/28273 | 257/320 |
| 2009/0166708 A1* | 7/2009 | Io | H01L 21/28273 | 257/319 |
| 2009/0200597 A1* | 8/2009 | Sakai | H01L 21/28273 | 257/320 |
| 2009/0207662 A1* | 8/2009 | Wang | H01L 27/11521 | 365/185.18 |
| 2009/0242959 A1* | 10/2009 | Lin | H01L 21/28273 | 257/319 |
| 2010/0054043 A1* | 3/2010 | Liu | H01L 21/28273 | 365/185.29 |
| 2010/0255672 A1* | 10/2010 | Kidokoro | H01L 21/28273 | 438/594 |
| 2011/0006355 A1* | 1/2011 | Shen | H01L 27/11521 | 257/316 |
| 2011/0049603 A1* | 3/2011 | Pan | H01L 21/28273 | 257/316 |
| 2011/0049605 A1* | 3/2011 | Ishiguro | H01L 21/28132 | 257/316 |
| 2011/0076816 A1* | 3/2011 | Liu | H01L 21/28273 | 438/264 |
| 2011/0248328 A1* | 10/2011 | Shen | H01L 21/28273 | 257/316 |
| 2012/0261736 A1* | 10/2012 | Hsu | H01L 21/28273 | 257/315 |
| 2013/0032872 A1* | 2/2013 | Kotov | H01L 21/28273 | 257/319 |
| 2013/0223148 A1* | 8/2013 | Seo | H01L 27/04 | 365/185.11 |
| 2014/0091382 A1* | 4/2014 | Tadayoni | H01L 21/28273 | 257/320 |
| 2014/0126299 A1* | 5/2014 | Fukumoto | G11C 16/0416 | 365/185.33 |
| 2014/0203343 A1* | 7/2014 | Wang | H01L 21/28273 | 257/315 |
| 2014/0217489 A1* | 8/2014 | Wang | H01L 21/28273 | 257/315 |
| 2015/0035040 A1* | 2/2015 | Yoo | H01L 29/7881 | 257/320 |
| 2015/0063038 A1* | 3/2015 | Lin | G11C 16/0408 | 365/185.29 |
| 2015/0187784 A1* | 7/2015 | Tan | H01L 27/11551 | 257/321 |
| 2015/0236031 A1* | 8/2015 | Mantelli | H01L 27/11524 | 365/185.28 |
| 2015/0263010 A1* | 9/2015 | Chuang | H01L 27/11534 | 257/319 |
| 2015/0263123 A1* | 9/2015 | Cheng | H01L 29/66825 | 257/319 |
| 2015/0270273 A1* | 9/2015 | Ma | H01L 27/11548 | 257/316 |
| 2015/0333173 A1* | 11/2015 | Wu | H01L 29/42324 | 257/320 |
| 2015/0364558 A1* | 12/2015 | Wu | H01L 29/42368 | 257/316 |
| 2015/0372121 A1* | 12/2015 | Chen | H01L 29/66825 | 257/320 |
| 2016/0013195 A1* | 1/2016 | Tsao | H01L 29/42328 | 257/316 |
| 2016/0013198 A1* | 1/2016 | Liu | H01L 27/11524 | 257/322 |
| 2016/0027517 A1* | 1/2016 | Kim | G11C 16/14 | 365/185.33 |
| 2016/0043095 A1* | 2/2016 | Yang | H01L 29/42328 | 257/319 |
| 2016/0064401 A1* | 3/2016 | Min | H01L 27/11568 | 257/324 |
| 2016/0087056 A1* | 3/2016 | Wu | H01L 29/42328 | 257/320 |
| 2016/0141407 A1* | 5/2016 | Chiba | H01L 23/528 | 257/316 |
| 2016/0163876 A1* | 6/2016 | Wu | H01L 29/66825 | 257/320 |
| 2016/0181266 A1* | 6/2016 | Chuang | H01L 27/11541 | 257/316 |
| 2016/0190268 A1* | 6/2016 | Wu | H01L 29/0649 | 257/316 |
| 2016/0204118 A1* | 7/2016 | Wu | H01L 29/7881 | 257/316 |

(56) References Cited

U.S. PATENT DOCUMENTS

| | | | | |
|---|---|---|---|---|
| 2016/0247812 A1* | 8/2016 | Chang | ............ | H01L 29/7831 |
| 2016/0307909 A1* | 10/2016 | Tseng | ............ | H01L 27/1157 |
| 2016/0307911 A1* | 10/2016 | Wu | ............ | H01L 27/11548 |
| 2016/0308069 A1* | 10/2016 | Tseng | ............ | H01L 29/792 |
| 2016/0358928 A1* | 12/2016 | Wu | ............ | H01L 29/7831 |
| 2016/0365350 A1* | 12/2016 | Chuang | ............ | H01L 27/11541 |
| 2016/0379987 A1* | 12/2016 | Liu | ............ | H01L 27/11524 |
| | | | | 257/316 |
| 2017/0062447 A1* | 3/2017 | Mukai | ............ | H01L 29/42328 |
| 2017/0125434 A1* | 5/2017 | Min | ............ | H01L 27/11568 |
| 2017/0162590 A1* | 6/2017 | Chuang | ............ | H01L 27/11534 |
| 2017/0221911 A1* | 8/2017 | Yi | ............ | H01L 27/11507 |
| 2017/0243946 A1* | 8/2017 | Pan | ............ | H01L 29/42328 |

OTHER PUBLICATIONS

Alison Wood, et al.; "Etching Silicon Nitride and Silicon Oxide Using Ethylene Glycol/Hydrofluoric Acid Mixtures"; http://www.electrochem.org/dl/ma/196/pdfs/1065.PDF; Sep. 22, 2014, p. 1.
U.S. Appl. No. 14/493,538, filed Sep. 23, 2014.
Non Final Office Action dated Oct. 27, 2015 U.S. Appl. No. 14/493,538.

\* cited by examiner

MEMORY CELL STRUCTURE FOR IMPROVING ERASE SPEED

BACKGROUND

Flash memory is an electronic non-volatile computer storage medium that can be electrically erased and reprogrammed. It is used in a wide variety of commercial and military electronic devices and equipment. To store information, flash memory includes an addressable array of memory cells, typically made from floating gate transistors. Common types of flash memory cells include stacked gate memory cells and split gate flash memory cells (e.g., the third generation SUPERFLASH (ESF3) memory cell). Split gate flash memory cells have several advantages over stacked gate memory cells, such as lower power consumption, higher injection efficiency, less susceptibility to short channel effects, and over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
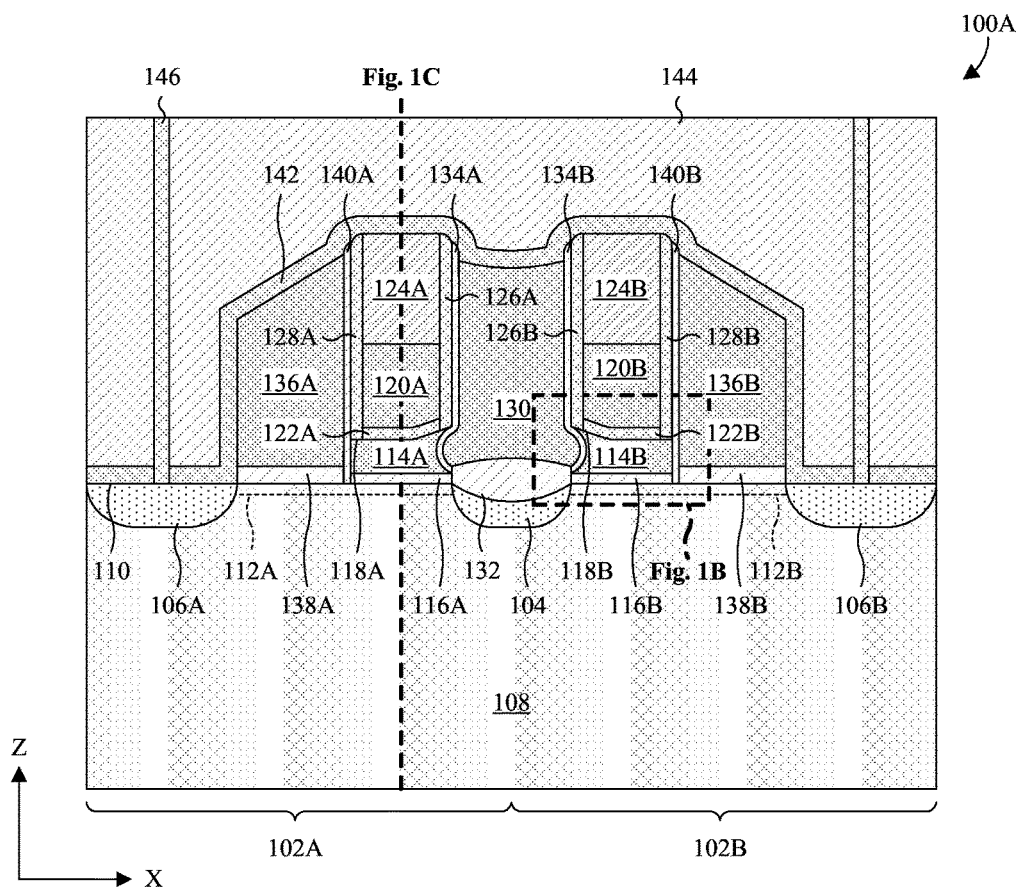
FIG. 1A illustrates a cross-sectional view of some embodiments of a semiconductor structure for a pair of split-gate flash memory cells with an asymmetric floating gate.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some split-gate flash memory cells include a floating gate arranged over a channel region of a semiconductor substrate, and separated from the channel region by a floating gate dielectric layer. The channel region laterally separates source and drain regions of the semiconductor substrate from one another. A control gate is arranged over the floating gate, and is separated from the floating gate by a control gate dielectric layer. The control gate is narrower than the floating gate, such that source-side and drain-side portions of the floating gate upper surface extend horizontally past opposing vertical sidewall surfaces of the control gate. Source-side and drain-side sidewall spacers are arranged along the opposing vertical sidewall surfaces of the control gate, and over the source-side and drain-side portions of the floating gate upper surface. A tunneling dielectric layer is arranged along source-side vertical sidewall surfaces of the floating gate and the source-side sidewall spacer. An erase gate is arranged laterally adjacent to the floating gate over the source region.

The erase gate is separated from the control gate by both the source-side spacer and the tunneling dielectric layer. Collectively, the source-side spacer and the tunneling dielectric layer electrically isolate the control gate from the erase gate, even when the erase gate is biased. In contrast, the erase gate is separated from the floating gate by the tunneling dielectric layer, but not the source-side spacer. As a result, electrons from the floating gate may tunnel by Fowler-Nordheim tunneling (FNT) through the tunneling dielectric layer when the erase gate is biased, as is the case during an erase mode of operation. A tunneling rate at which the electrons tunnel through the tunneling dielectric layer, in part, determines erase speed. The tunneling rate of the electrons is determined, in part, by a thickness and uniformity of the tunneling dielectric layer, the bias applied to the erase gate, and a shape of the floating gate.

In view of the foregoing, the present disclosure is directed to a split-gate flash memory cell, as well as a method for manufacturing the split-gate flash memory cell. The split-gate flash memory cell improves erase speed over some conventional split-gate flash memory cells through use of an asymmetric floating gate profile. According to some embodiments of the split-gate flash memory cell, a floating gate and an erase gate are laterally spaced over a semiconductor substrate by a tunneling dielectric layer. The floating gate has a concave sidewall surface neighboring the erase gate, and has a height increasing towards the erase gate, thereby defining a tip at an interface between an upper surface of the floating gate and the concave sidewall surface of the floating gate. A control gate and a sidewall spacer are arranged over the upper surface of the floating gate. The control gate is laterally offset from the tip of the floating gate, and the sidewall spacer is laterally arranged between the control gate and the tip.

Advantageously, the tip provides a faster path for tunneling electrons through the tunneling dielectric layer, as compared to a floating gate with a planar sidewall surface. The tip consequently improves erase speed of the split-gate flash memory cell over some conventional memory devices with planar floating gate sidewall surfaces.

With reference to FIG. 1A, a cross-sectional view 100A of some embodiments of a semiconductor structure for a pair of memory cells 102A, 102B is provided. The memory cells 102A, 102B are split-gate flash memory cells, such as third generation SUPERFLASH (ESF3) memory cells, and may be mirror images of one another. The memory cells 102A, 102B include a first memory cell 102A and a second memory cell 102B.

A source/drain region 104 common to the memory cells 102A, 102B, and source/drain regions 106A, 106B individual to the memory cells 102A, 102B, are embedded in a semiconductor substrate 108. Typically, the common source/drain region 104 is a source region, and the individual source/drain regions 106A, 106B are drain regions. The source/drain regions 104, 106A, 106B are laterally spaced along an upper surface 110 of the semiconductor substrate 108, with the individual source/drain regions 106A, 106B arranged on opposing sides of the common source/drain region 104. Channel regions 112A, 112B extend laterally along the upper surface 110 of the semiconductor substrate 108 between the common source/drain region 104 and individual source/drain regions 106A, 106B of the corresponding memory cells 102A, 102B.

Floating gates 114A, 114B individual to the memory cells 102A, 102B are arranged over the channel regions 112A, 112B of the corresponding memory cells 102A, 102B on opposing sides of the common source/drain region 104. The floating gates 114A, 114B are vertically spaced and electrically isolated from the channel regions 112A, 112B by underlying floating gate dielectric layers 116A, 116B corresponding to the memory cells 102A, 102B. Further, the floating gates 114A, 114B have asymmetric profiles about vertical axes that bisect the floating gates 114A, 114B. In some embodiments, heights of the floating gates 114A, 114B increase towards the common source/drain region 104. In other embodiments, the height of the floating gates 114A, 114B may be substantially constant. Common-side sidewall surfaces of the floating gates 114A, 114B neighboring the common source/drain region 104 are concave, and individual-side sidewall surfaces of the floating gates 114A, 114B neighboring the individual source/drain regions 106A, 106B are typically planar. The common-side sidewall surfaces of the floating gates 114A, 114B define tips at interfaces between upper surfaces 118A, 118B of the floating gates 114A, 114B and the common-side sidewall surfaces. As seen hereafter, the tips advantageously increase erase speed by increasing electric field strength at the tips.

Control gates 120A, 120B are arranged over the floating gates 114A, 114B. The control gates 120A, 120B are vertically spaced and electrically isolated from the floating gates 114A, 114B by underlying control gate dielectric layers 122A, 122B corresponding to the memory cells 102A, 102B. The control gate dielectric layers 122A, 122B may be, for example, multi-layer oxide-nitride-oxide (ONO) films. Further, the control gates 120A, 120B are masked by overlying hard masks 124A, 124B.

The control gates 120A, 120B, the control gate dielectric layers 122A, 122B, and the hard masks 124A, 124B share a common footprint and are narrower than the floating gates 114A, 114B. As such, portions of the floating gate upper surfaces 118A, 118B extend laterally past opposing sidewall surfaces of the control gates 120A, 120B, the control gate dielectric layers 122A, 122B, and the hard masks 124A, 124B to form floating gate ledges proximate the common and individual source/drain regions 104, 106A, 106B. Common-side sidewall spacers 126A, 126B and individual-side sidewall spacers 128A, 128B are arranged on the ledges along the opposing sidewall surfaces of the control gates 120A, 120B, the control gate dielectric layers 122A, 122B, and the hard masks 124A, 124B. The sidewall spacers 126A, 126B, 128A, 128B may be, for example, multi-layer ONO films.

An erase gate 130 is arranged laterally adjacent to the floating gates 114A, 114B, and over the common source/drain region 104. The erase gate 130 is vertically spaced and electrically isolated from the common source/drain region 104 by an underlying erase gate dielectric layer 132. Further, the erase gate 130 is laterally spaced from the floating gates 114A, 114B and the common-side sidewall spacers 126A, 126B by common-side, tunneling dielectric layers 134A, 134B. The tunneling dielectric layers 134A, 134B provide tunneling paths (e.g., by FNT) between the floating gates 114A, 114B and the erase gate 130. The tunneling dielectric layers 134A, 134B are disposed conformally along the common-side sidewall spacers 126A, 126B and the floating gate sidewall surfaces neighboring the erase gate 130.

Word lines 136A, 136B corresponding to the memory cells 102A, 102B are arranged over the channel regions 112A, 112B, between the floating gates 114A, 114B and the individual source/drain regions 106A, 106B. The word lines 136A, 136B are vertically spaced and electrically isolated from the channel regions 112A, 112B by underlying word line dielectric layers 138A, 138B. Further, the word lines 136A, 136B are laterally spaced and electrically isolated from the floating gates 114A, 114B and the individual-side sidewall spacers 128A, 128B by individual-side dielectric layers 140A, 140B. The individual-side dielectric layers 140A, 140B extend along the individual-side sidewall spacers 128A, 128B and the floating gate sidewall surfaces neighboring the word lines 136A, 136B.

A contact etch stop layer 142 is arranged over the semiconductor structure. The contact etch stop layer 142 conformally lines outward facing surfaces of the word lines 136A, 136B, the hard masks 124A, 124B, and the erase gate 130. Further, an interlayer dielectric (ILD) layer 144 is arranged over the contact etch stop layer 142, typically with a planar upper surface, and contacts 146 extend through the ILD layer 144 and the contact etch stop layer 142 to one or more of the source/drain regions 104, 106A, 106B, the word lines 136A, 136B, the erase gate 130, and the control gates 120A, 120B.

Although not illustrated, in some embodiments, the hard masks 124A, 124B are omitted. Further, upper surfaces of the control gates 120A, 120B, the word lines 136A, 136B, the erase gate 130, the tunneling dielectric layers 134A, 134B, the individual-side dielectric layers 140A, 140B, the common-side sidewall spacers 126A, 126B, and the individual-side sidewall spacers 128A, 128B have substantially coplanar upper surfaces. Such embodiments are common where the memory cells 102A, 102B are used in high κ metal gate (HKMG) embedded flash devices.

During operation of the memory cells 102A, 102B, the floating gates 114A, 114B store different amounts of charge representing different data states (e.g., a binary "1" and a binary "0"). Read operations are performed to determine the data states of the floating gates 114A, 114B, and program and erase operations are performed to change data states of the floating gates 114A, 114B.

Regarding read operations, the control gates 120A, 120B and the word lines 136A, 136B collectively control the flow of charge carriers in the underlying channel regions 112A, 112B. Further, charge stored in the floating gates 114A, 114B screens electric fields between the control gates 120A, 120B and the channel regions 112A, 112B to change the threshold voltages for the control gates 120A, 120B, depending upon data state. Therefore, the data state of one of the floating gate 114A, 114B can be determined by measuring the resistance of the underlying channel region 112A, 112B when the corresponding word line 136A, 136B is biased with a voltage exceeding a word line threshold voltage, and the corresponding control gate 120A, 120B is biased with a voltage that is intermediate control gate threshold voltages for data states.

Regarding program and erase operations, electric fields are produced by the control gates 120A, 120B and the erase gate 130 to promote the migration of charge into and/or out of the floating gates 114A, 114B. Typically, program operations are carried out using source-side injection (SSI), and erase operations are carried out using FNT. However, it is to be appreciated that program operations may also be performed using FNT. One challenge with FNT is that it is typically slow compared to SSI. The tips of the floating gates 114A, 114B advantageously concentrate electric fields and increase the speed of FNT.

Figure 1B:
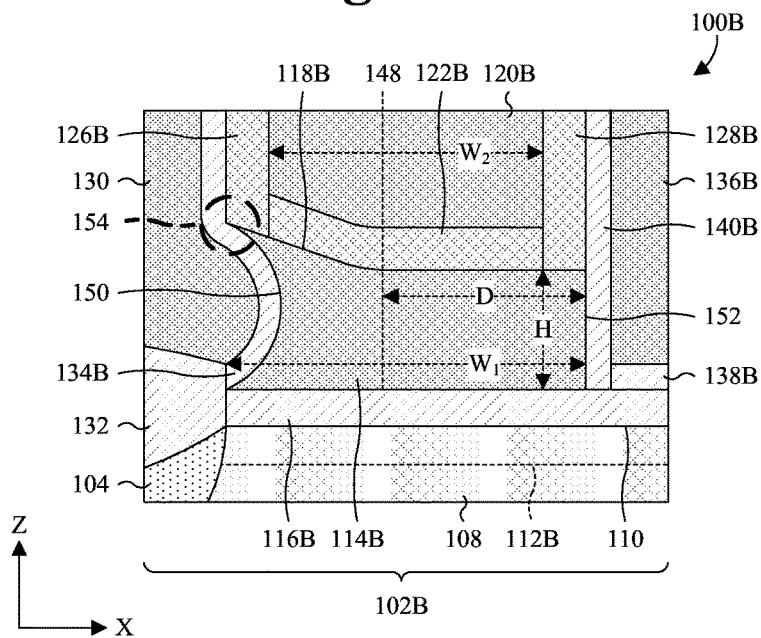
FIG. 1B illustrates an enlarged cross-sectional view of some embodiments of the asymmetric floating gate of FIG. 1A.

With reference to FIG. 1B, an enlarged cross-sectional view 100B of some embodiments of the floating gate 114B for the second memory cell 102B is provided. The floating gate 114B has an asymmetric profile about a vertical axis 148 that bisects the upper surface 118B of the floating gate 114B. A common-side sidewall surface 150 of the floating gate 114B that neighbors the erase gate 130 is concave, and an individual-side sidewall surface 152 that neighbors the word line 136B for the second memory cell 102B is typically planar. The common-side sidewall surface 150 defines a tip 154 at an interface between the upper surface 118B of the floating gate 114B and the common-side sidewall surface 150. The tip 154 points towards the erase gate 130 and increases electric field strength between the erase gate 130 and the floating gate 114B during erase operations, since electric field increases in strength as radius of curvature decreases. This, in turn, increases electron tunneling and erase speed.

A height H of the floating gate 114B increases towards the erase gate 130. In some embodiments, the height H is substantially uniform from the individual-side sidewall surface 152 of the floating gate 114B to a point in the floating gate 114B that is laterally offset from the individual-side sidewall surface 152 by a distance D. Thereafter, the height H gradually increases from the point to the tip 154. The distance D may be, for example, between about 40% and about 60%, such as about 55% or about 45%, of a width $W_1$ of the floating gate 114B. The width $W_1$ of the floating gate 114B extends laterally between the individual-side sidewall surface 152 and the tip 154. Further, the width $W_1$ of the floating gate 114B is greater than widths $W_2$ of the overlying control gate dielectric layer 122B, the overlying control gate 120B, and the overlying hard mask 124B (see FIG. 1A). The differences in the widths $W_1$, $W_2$ lead to ledges overlying the floating gate 114B, upon which the sidewall spacers 126B, 128B for the second memory cell 102B rest.

Figure 1C:
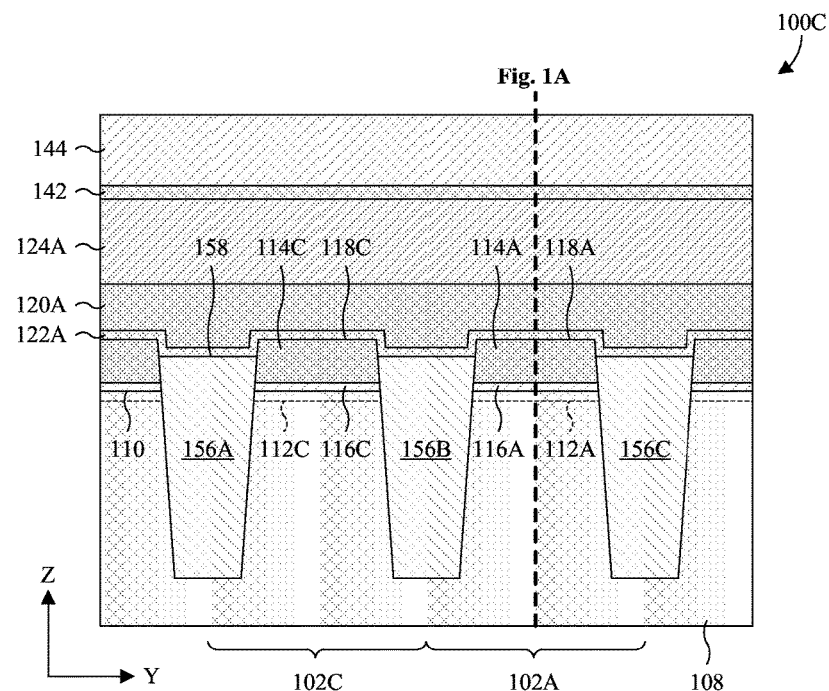
FIG. 1C illustrates a cross-sectional view of some embodiments of the semiconductor structure of FIG. 1A, wherein the cross-sectional view of FIG. 1C is orthogonal to the cross-sectional view of FIG. 1A.

With reference to FIG. 1C, a cross-sectional view 100C of some embodiments of the semiconductor structure is provided. The cross-sectional view 100C is orthogonal to the cross-sectional view 100A of FIG. 1A. The semiconductor structure includes memory cells 102A, 102C laterally spaced by isolation regions 156A, 156B, 156C extending into the semiconductor substrate 108. The isolation regions 156A, 156B, 156C may be, for example, shallow trench isolation (STI) regions, and are typically line-shaped and typically arranged in parallel. In some embodiments, the isolation regions 156A, 156B, 156C have upper surfaces 158 elevated relative to the upper surface 110 of the semiconductor substrate 108. In such embodiments, because the upper surfaces 158 of the isolation regions 156A, 156B, 156C are elevated relative to the upper surface 110 of the semiconductor substrate 108, gaps are defined between the isolation regions 156A, 156B, 156C.

Floating gates 114A, 114C corresponding to the memory cells 102A, 102C are arranged over the semiconductor substrate 108 between the isolation regions 156A, 156B, 156C. The floating gates 114A, 114C are vertically spaced from channel regions 112A, 112C corresponding to the memory cells 102A, 102C by floating gate dielectric layers 116A, 116C. The channel regions 112A, 112C extend along the upper surface 110 of the semiconductor substrate 108, and the floating gate dielectric layers 116A, 116B are arranged between the channel regions 112A, 112C and the floating gates 114A, 114C. Upper surfaces 118A, 118C of the floating gates 114A, 114C are typically elevated relative to the upper surfaces 158 of the isolation regions 156A, 156B, 156C.

A control gate 120A is arranged over the floating gates 114A, 114C and extends laterally across the floating gates 114A, 114C. The control gate 120A is vertically spaced and electrically isolated from the floating gates 114A, 114C and the isolation regions 156A, 156B, 156C by a control gate dielectric layer 122A, and masked by a hard mask 124A. Typically, the control gate dielectric layer 122A is conformal. The hard mask 124A is lined by a contact etch stop layer 142, and an ILD layer 144 is arranged over the contact etch stop layer 142. Although not shown, a contact typically extends through the contact etch stop layer 142 and the ILD layer 144 to the control gate 120A.

Figure 1D:
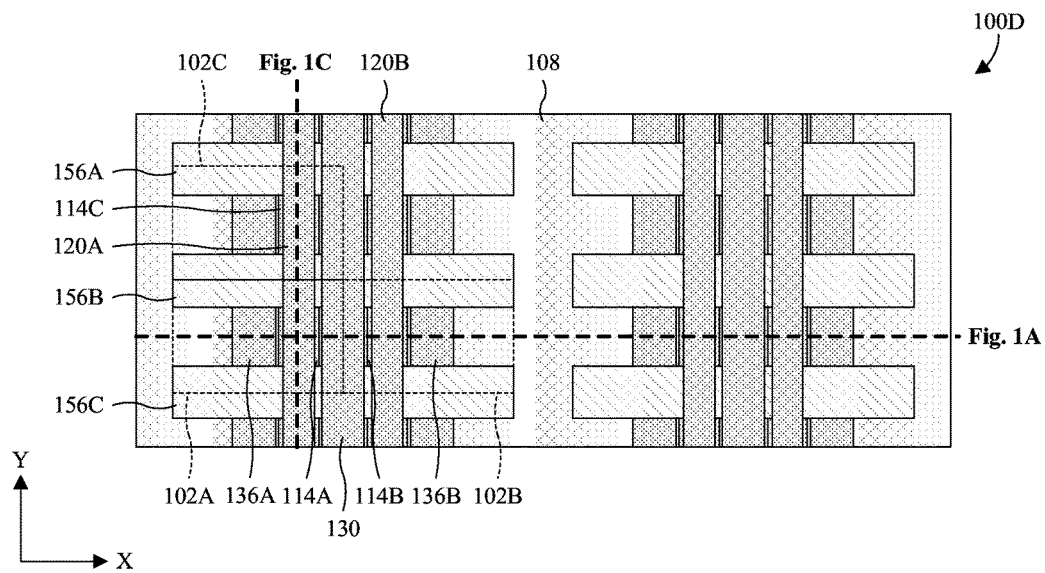
FIG. 1D illustrates a top view of some embodiments of the semiconductor structure of FIG. 1A.

With reference to FIG. 1D, a top view 100D of some embodiments of the semiconductor structure is provided. The semiconductor structure includes an array of memory cells 102A, 102B, 102C arranged in rows and columns. The memory cells 102A, 102B, 102C are supported by the semiconductor substrate 108, and arranged between an array of isolation regions 156A, 156B, 156C in the semiconductor substrate 108. The isolation regions 156A, 156B, 156C are arranged in rows and columns in the semiconductor substrate 108. Typically, the number of rows for the isolation regions 156A, 156B, 156C is one more than the number of rows for the memory cells 102A, 102B, 102C, and the number of columns for the isolation regions 156A, 156B, 156C is half the number of columns for the memory cells 102A, 102B, 102C. For example, the isolation regions 156A, 156B, 156C may have 2 rows and 2 columns, whereas the memory cells 102A, 102B, 102C may have 1 row and 4 columns.

Word lines 136A, 136B and floating gates 114A, 114B, 114C are arranged in rows and columns between the isolation regions 156A, 156B, 156C. Typically, for each row of the memory cell array, the word lines 136A, 136B of the row are electrically coupled together. For example, the word lines 136A may be electrically coupled together in a back-end-of-line (BEOL) metallization stack overlying the word lines 136A. Erase gates 130 corresponding to pairs of neighboring memory cells 102A, 102B, 102C are arranged between the floating gates 114A, 114B, 114C of the corresponding pairs. Further, control gates 120A, 120B individual to the columns of the memory cells 102A, 102B, 102C are arranged over the floating gates 114A, 114B.

Figure 2:
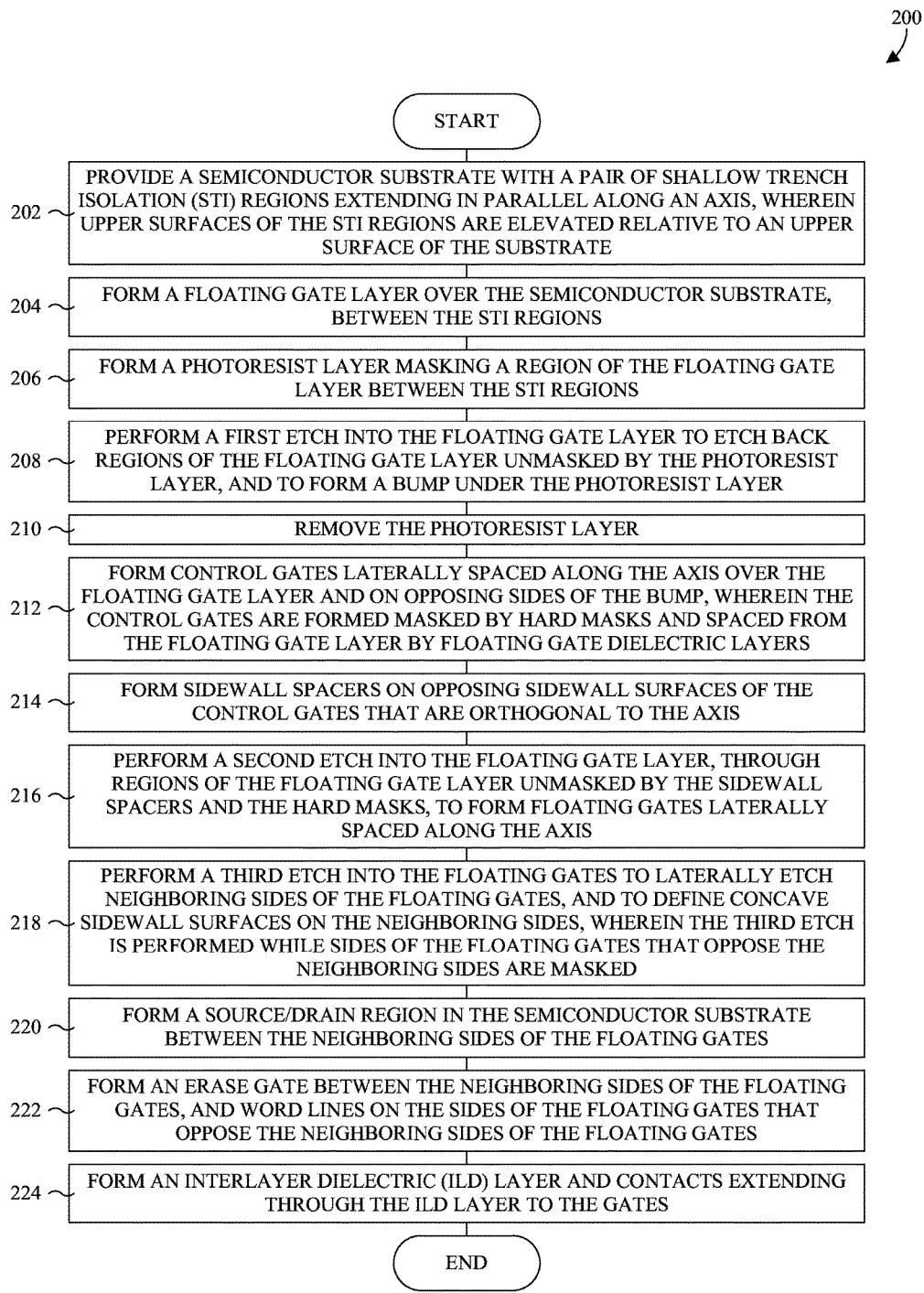
FIG. 2 illustrates a flowchart of some embodiments of a method for manufacturing a split-gate flash memory cell with an asymmetric floating gate.

With reference to FIG. 2, a flowchart 200 provides some embodiments of a method for manufacturing a split-gate flash memory cell with an asymmetric floating gate.

At 202, a semiconductor substrate with a pair of STI regions is provided. The STI regions extend in parallel along an axis, with upper surfaces that are elevated relative to an upper surface of the semiconductor substrate.

At 204, a floating gate layer is formed over the semiconductor substrate, between the STI regions.

At 206, a photoresist layer is formed to mask a region of the floating gate layer between the STI regions.

At 208, a first etch is performed into the floating gate layer to etch back regions of the floating gate layer unmasked by the photoresist layer, and to form a bump under the photoresist layer.

At 210, the photoresist layer is removed.

At 212, control gates are laterally spaced along the axis over the floating gate layer and on opposing sides of the bump. The control gates are formed according to overlying hard masks and are spaced from the floating gate layer by floating gate dielectric layers.

At 214, sidewall spacers are formed on opposing sidewall surfaces of the control gates that are orthogonal to the axis.

At 216, a second etch is performed into the floating gate layer, through regions of the floating gate layer unmasked by the sidewall spacers and the hard masks, to form floating gates laterally spaced along the axis.

At 218, a third etch is performed into the floating gates to laterally etch neighboring sides of the floating gates, and to define concave sidewall surfaces on the neighboring sides. The third etch is performed while sides of the floating gates that oppose the neighboring sides are masked. The third etch advantageously forms tips at the interfaces between upper surfaces of the floating gates and the concave sidewall surfaces. Because the tips have low radiuses of curvature, electric fields concentrate in the tips and FNT along the tips is enhanced. This, in turn, leads to increased erase speed.

At 220, a source/drain region is formed in the semiconductor substrate between the neighboring sides of the floating gates.

At 222, an erase gate is formed between the neighboring sides of the floating gates. Further, word lines are formed on the sides of the floating gates that oppose the neighboring sides of the floating gates.

At 224, an ILD layer and contacts extending through the ILD layer to the gates are formed.

While the disclosed method (e.g., the method described by the flowchart 200) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 3-8, 9A & B, 10-20, and 21A & B, cross-sectional views of some embodiments of a semiconductor structure at various stages of manufacture are provided to illustrate the method of FIG. 2. Although FIGS. 3-8, 9A & B, 10-20, and 21A & B are described in relation to the method, it will be appreciated that the structures disclosed in FIGS. 3-8, 9A & B, 10-20, and 21A & B are not limited to the method, but instead may stand alone as structures independent of the method. Similarly, although the method is described in relation to FIGS. 3-8, 9A & B, 10-20, and 21A & B, it will be appreciated that the method is not limited to the structures disclosed in FIGS. 3-8, 9A & B, 10-20, and 21A & B, but instead may stand alone independent of the structures disclosed in FIGS. 3-8, 9A & B, 10-20, and 21A & B.

Figure 3:
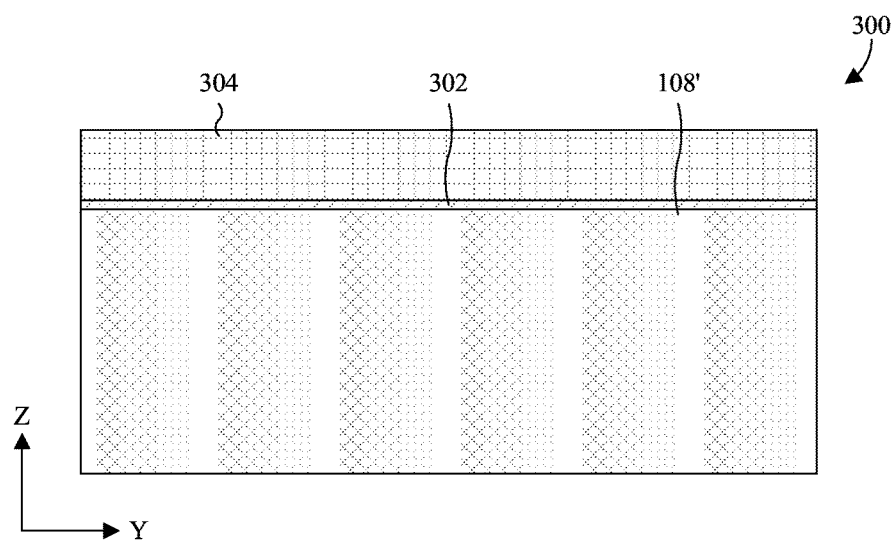
FIGS. 3-8, 9A & B, 10-20, and 21A & B illustrate a series of cross-sectional views of some embodiments of a semiconductor structure at various stages of manufacture, wherein the semiconductor structure includes a pair of split-gate flash memory cells with an asymmetric floating gate.
Figure 4:
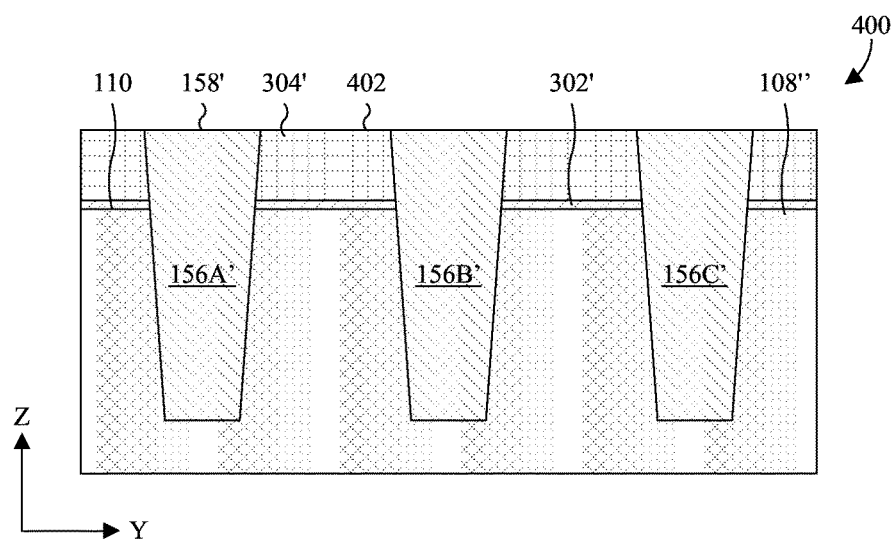
Figure 5:
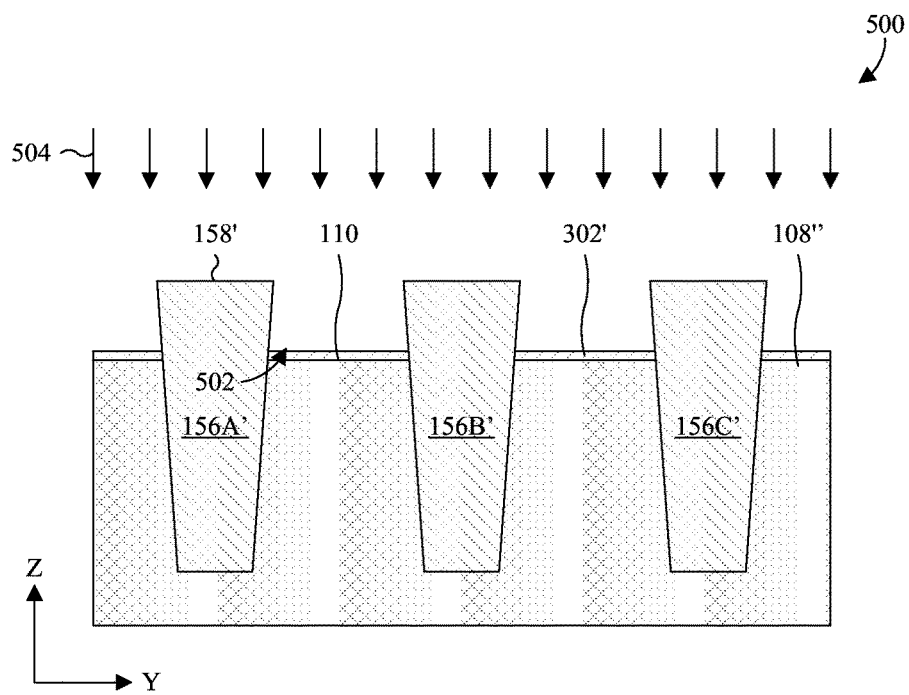

FIGS. 3-5 illustrate cross-sectional views 300, 400, 500 of some embodiments corresponding to Act 202.

As illustrated by FIG. 3, a semiconductor substrate 108' is provided. The semiconductor substrate 108' may be, for example, a bulk semiconductor substrate or a silicon-on-insulator (SOI) substrate. Further, first and second pad layers 302, 304 are formed stacked over the semiconductor substrate 108', with the second pad layer 304 overlying the first pad layer 302. In some embodiments, the first pad layer 302 is formed as an oxide, such as silicon dioxide, and/or the second pad layer 304 is formed as a nitride, such as silicon nitride. The first and second pad layers 302, 304 may be formed according to chemical vapor deposition (CVD), physical vapor deposition (PVD), or any other suitable deposition technique.

As illustrated by FIG. 4, STI regions 156A', 156B', 156C' are formed laterally spaced over the semiconductor substrate 108' (see FIG. 3), and extending into the semiconductor substrate 108' through the first and second pad layers 302, 304 (see FIG. 3). The STI regions 156A', 156B', 156C' are formed with upper surfaces 158' elevated relative to an upper surface 110 of the remaining semiconductor substrate 108" and approximately coplanar with an upper surface 402 of the remaining second pad layer 304'.

The process for forming the STI regions 156A', 156B', 156C' may include performing a selective etch into the semiconductor substrate 108', through the first and second pad layers 302, 304, to form trenches corresponding to the STI regions 156A', 156B', 156C'. A dielectric layer may then be formed filling the trenches using CVD, spin coating, or any other suitable deposition technique. Further, a chemical mechanical polish (CMP) may be performed into the dielectric layer. The CMP may be performed to about even with the upper surface 402 of the remaining second pad layer 304'.

As illustrated by FIG. 5, a first etch is performed through the second pad layer 304' (see FIG. 4), to the first pad layer 302', thereby removing the second pad layer 304'. The first etch exposes gaps 502 between the STI regions 156A', 156B', 156C'. The process for performing the first etch may include applying an etchant 504 to the second pad layer 304'. The etchant 504 may be selective of the second pad layer 304' relative to the first pad layer 302'.

FIGS. 6-8, 9A, and 9B illustrate cross-sectional views 600, 700, 800, 900A, 900B of some embodiments corresponding to Act 204. Further, FIGS. 9A & B are orthogonal to one another and, in some embodiments, correspond to FIGS. 1A & C.

Figure 6:
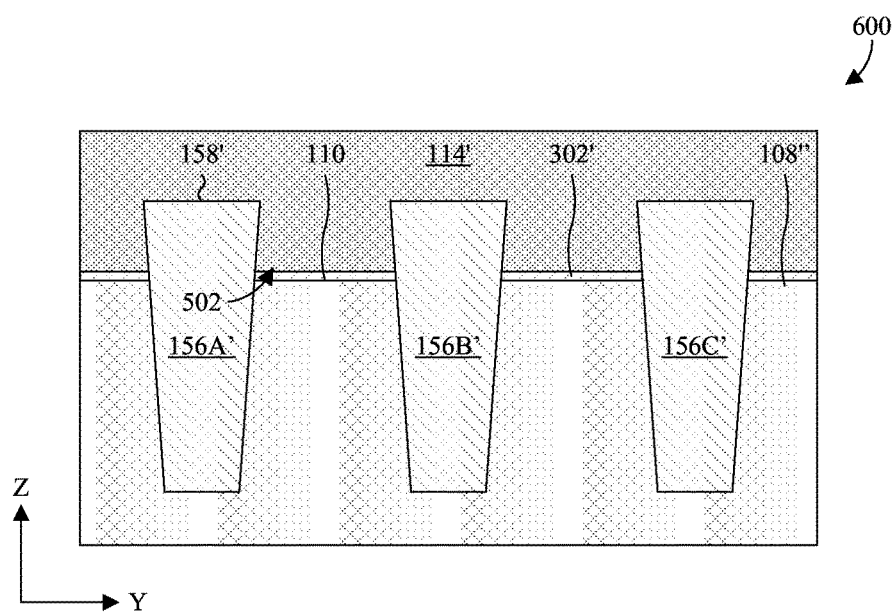

As illustrated by FIG. 6, a floating gate layer 114' is formed filling the gaps 502 over the STI regions 156A', 156B', 156C' and the first pad layer 302'. The floating gate layer 114' may be formed as, for example, a conductive material, such doped polysilicon. Further, the floating gate layer 114' may be formed according to CVD, spin coating, or any other suitable deposition technique.

Figure 7:
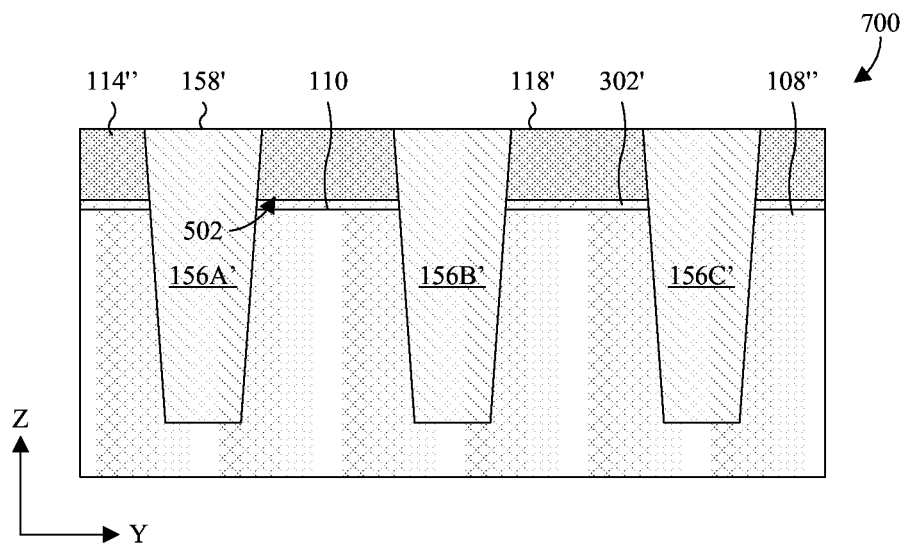

As illustrated by FIG. 7, a CMP is performed into the floating gate layer 114' (see FIG. 6) to about even with the upper surfaces 158' of the STI regions 156A', 156B', 156C'. The CMP coplanarizes the upper surfaces 158' of the STI regions 156A', 156B', 156C' with an upper surface 118' of the remaining floating gate layer 114".

Figure 8:
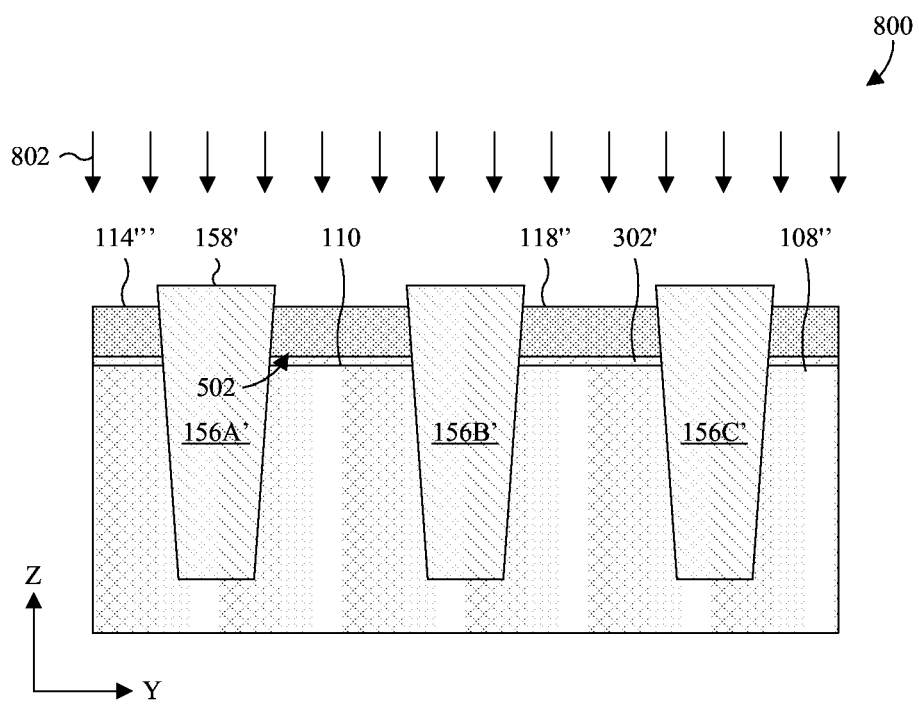

As illustrated by FIG. 8, a second etch is performed into the floating gate layer 114" (see FIG. 7) to etch back the floating gate layer 114" relative to the STI regions 156A', 156B', 156C'. After the second etch, the remaining floating gate layer 114''' has an upper surface 118" recessed relative to the upper surfaces 158' of the STI regions 156A', 156B', 156C'. The process for performing the second etch may include applying an etchant 802 to the floating gate layer 114". The etchant 802 may be selective of the floating gate layer 114" relative to the STI regions 156A', 156B', 156C'.

Figure 9A:
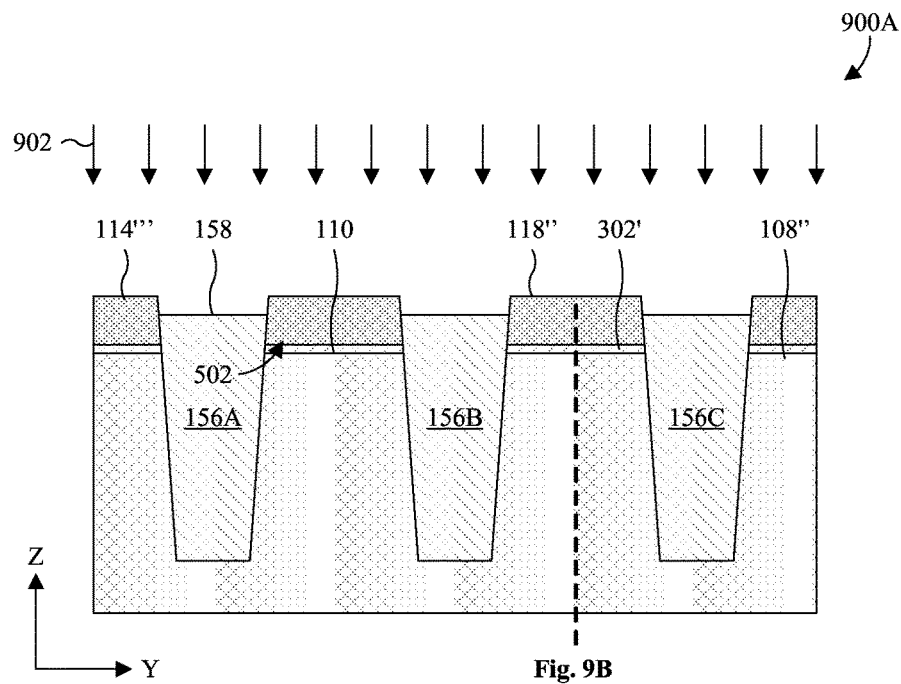
Figure 9B:
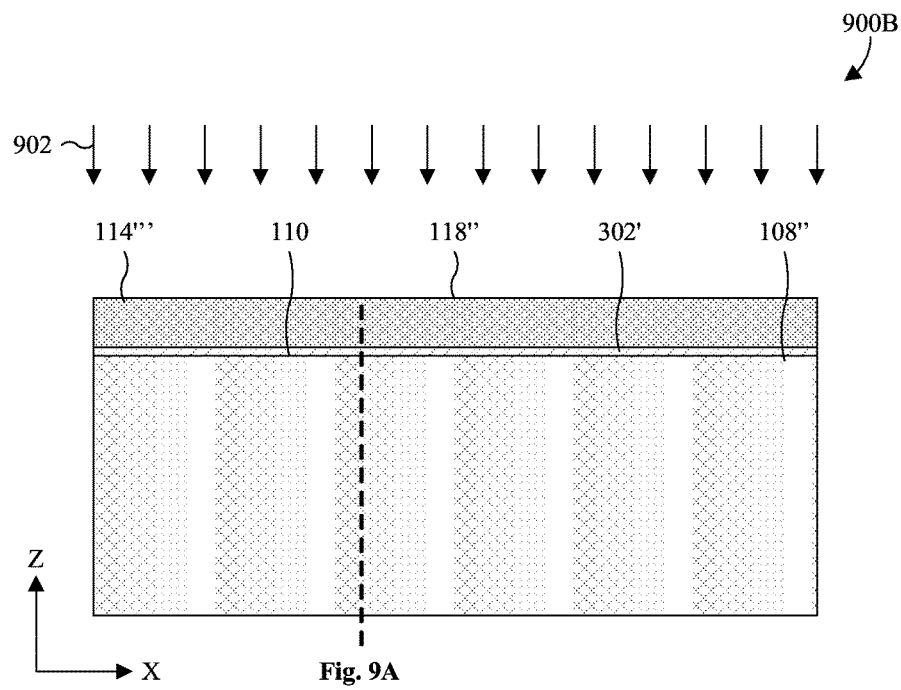

As illustrated by FIGS. 9A & B, a third etch is performed into the STI regions 156A', 156B', 156C' (see FIG. 8) to etch back the STI regions 156A', 156B', 156C' relative to the floating gate layer 114'''. After the third etch, the remaining STI regions 156A, 156B, 156C have upper surfaces 158 recessed relative to the upper surface 118" of the floating gate layer 114'''. The process for performing the third etch may include applying one or more etchants 902 to the STI regions 156A', 156B', 156C'. For example, the process for performing the third etch may include an oxide wet dip etch. The etchant 902 may be selective of the STI regions 156A', 156B', 156C' relative to the floating gate layer 114'''.

Figure 10:
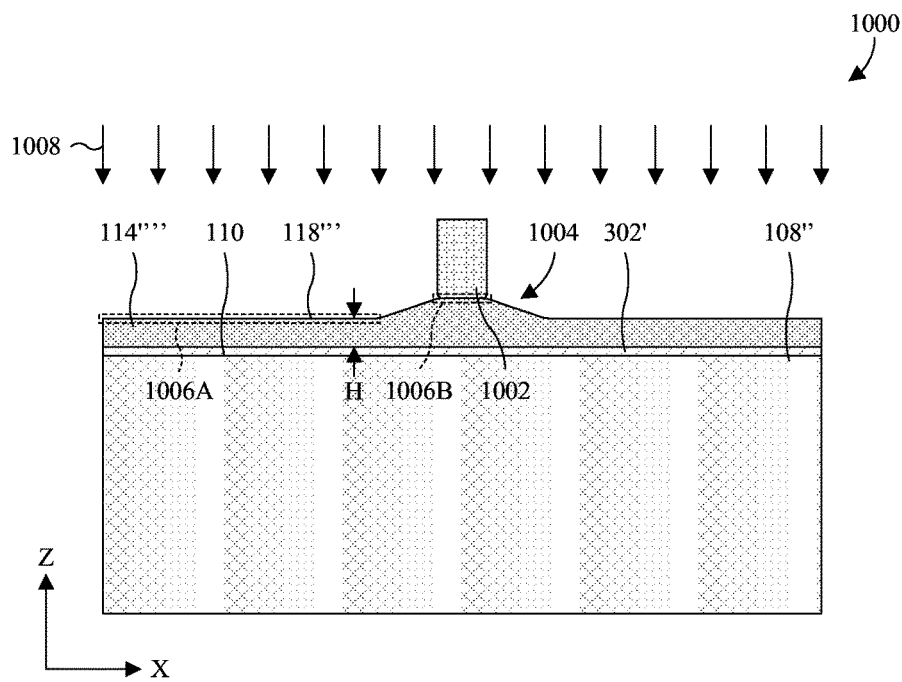

FIG. 10 illustrates a cross-sectional view 1000 of some embodiments corresponding to Acts 206, 208, and 210. As illustrated, a first photoresist layer 1002 is formed over a subset of the floating gate layer 114''' (see FIGS. 9A & B). Further, a fourth etch is performed into the floating gate layer 114''' to etch back regions of the floating gate layer 114''' unmasked by the first photoresist layer 1002. The fourth etch results in a bump 1004 in the remaining floating gate layer 114'''' that underlies the first photoresist layer 1002. At the interface of the bump 1004, the height H of the floating gate layer 114''' increases towards the first photoresist layer 1002, such that an upper surface 118''' of the remaining floating gate layer 114'''' has a lower region 1006A surrounding the first photoresist layer 1002, an upper region 1006B underlying the first photoresist layer 1002, and an upward slope between the lower region 1006A and the upper region 1006B. The fourth etch may be performed by applying an etchant 1008 to the floating gate layer 114'''. With the fourth etch performed, the first photoresist layer 1002 is removed.

Figure 11:
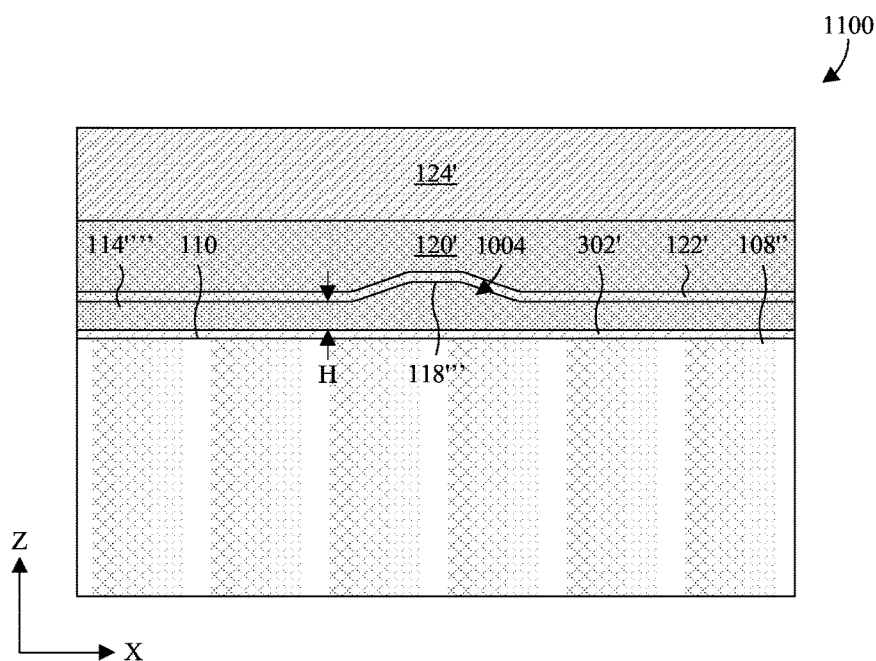
Figure 12:
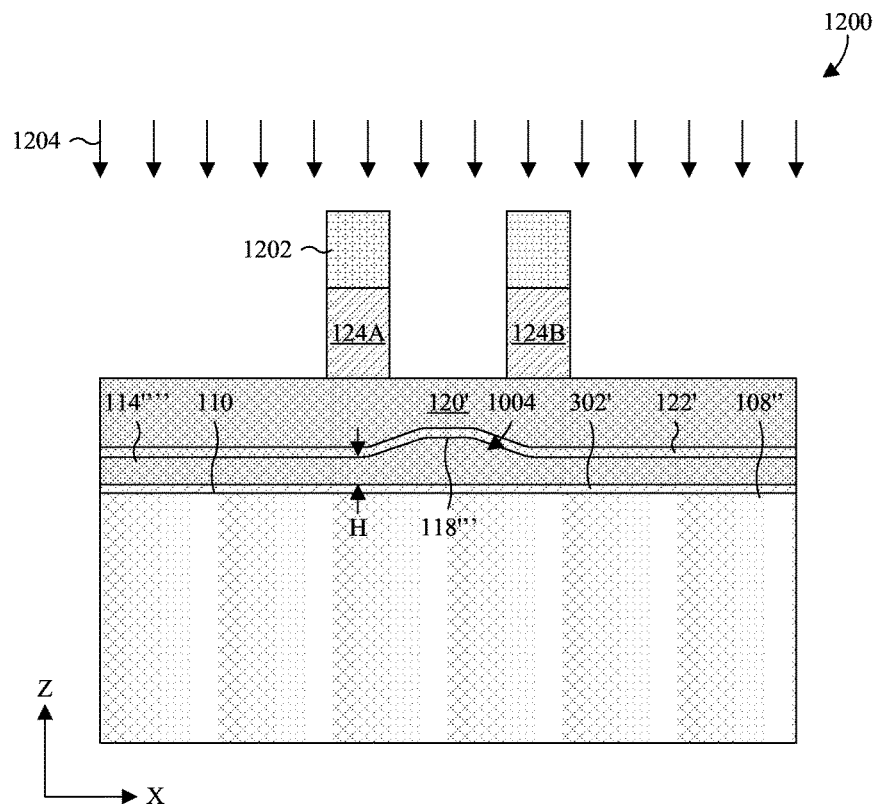
Figure 13:
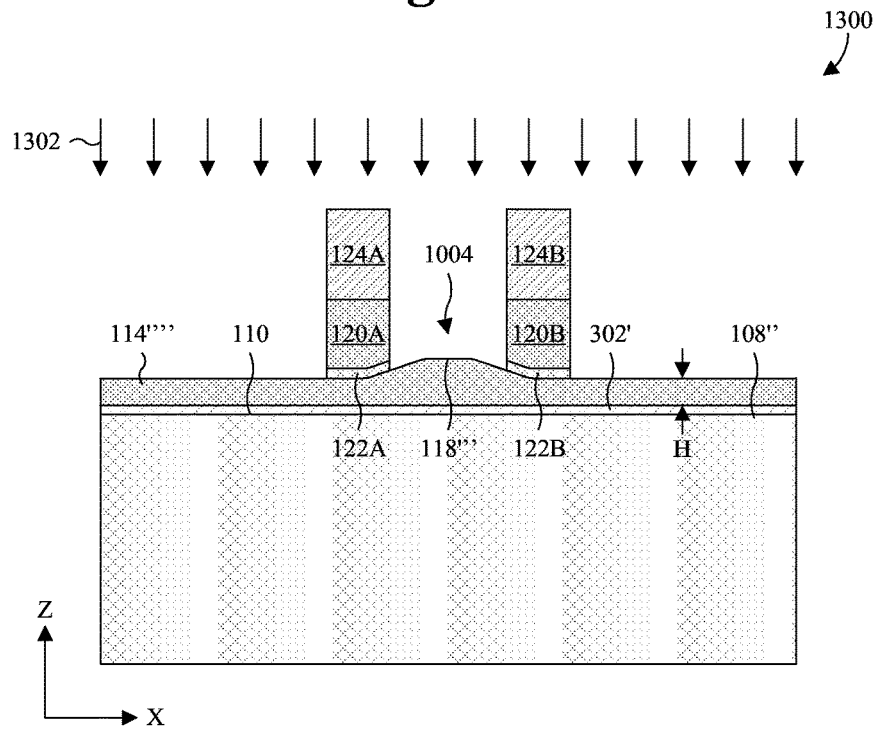

FIGS. 11-13 illustrate cross-sectional views 1100, 1200, 1300 of some embodiments corresponding to Act 212.

As illustrated by FIG. 11, a control gate dielectric layer 122', a control gate layer 120', and a hard mask layer 124' are formed stacked over the floating gate layer 114''''. The control gate dielectric layer 122' is typically formed conformally lining the floating gate layer 114''''. Further, the control gate dielectric layer 122' is typically formed of a multi-layer ONO film. The control gate layer 120' is formed over the control gate dielectric layer 122', and the hard mask layer 124' is formed over the control gate layer 120'. The control gate layer 120' is typically formed of a conductive material, such as doped polysilicon, and the hard mask layer 124' is typically formed of a nitride, such as silicon nitride. The control gate dielectric layer 122', the control gate layer 120', and the hard mask layer 124' may be formed using CVD or any other suitable deposition technique.

As illustrated by FIG. 12, a fifth etch is performed to the control gate layer 120', through select regions of the hard mask layer 124' (see FIG. 11). The fifth etch forms hard masks 124A, 124B masking gate regions of the control gate layer 120' that are laterally spaced on opposing sides of the floating gate layer bump 1004. In some embodiments, the hard masks 124A, 124B are arranged partially over the upward slope of the floating gate layer bump 1004. The process for performing the fifth etch may include forming a second photoresist layer 1202 masking the select regions of the hard mask layer 124'. Further, an etchant 1204 may be applied to the hard mask layer 124' according a pattern of the second photoresist layer 1202. The etchant 1204 may be selective of the hard mask layer 124' relative to the control gate layer 120'. Thereafter, the second photoresist layer 1202 may be removed.

As illustrated by FIG. 13, a sixth etch is performed to the floating gate layer 114'''', through regions of the control gate dielectric layer 122' and the control gate layer 120' unmasked by the hard masks 124A, 124B. The sixth etch results in control gates 120A, 120B laterally spaced on opposing sides of the floating gate layer bump 1004, and overlying corresponding control gate dielectric layers 122A, 122B. In some embodiments, the control gates 120A, 120B and the control gate dielectric layers 122A, 122B are arranged partially over the upward slop eof the floating gate layer bump 1004. The process for performing the sixth etch may include applying one or more etchants 1302 to exposed regions of the control gate dielectric layer 122' and the control gate layer 120'. For example, a first etchant selective of the control gate layer 120', relative to the control gate dielectric layer 122', may be applied to the control gate layer 120'. Thereafter, one or more second etchants selective of the control gate dielectric layer 122', relative to the floating gate layer 114'''', may be applied to the control gate dielectric layer 122'.

Figure 14:
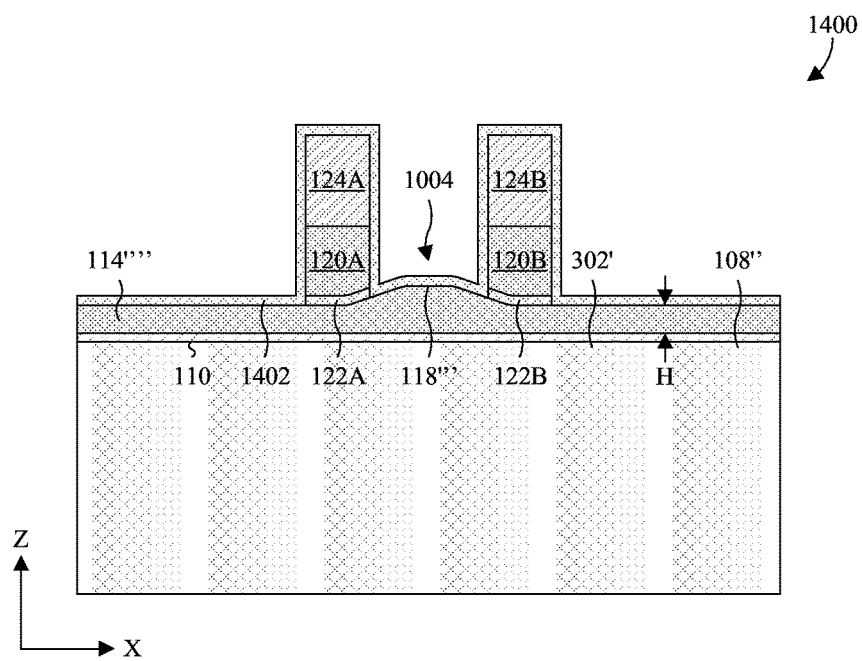
Figure 15:
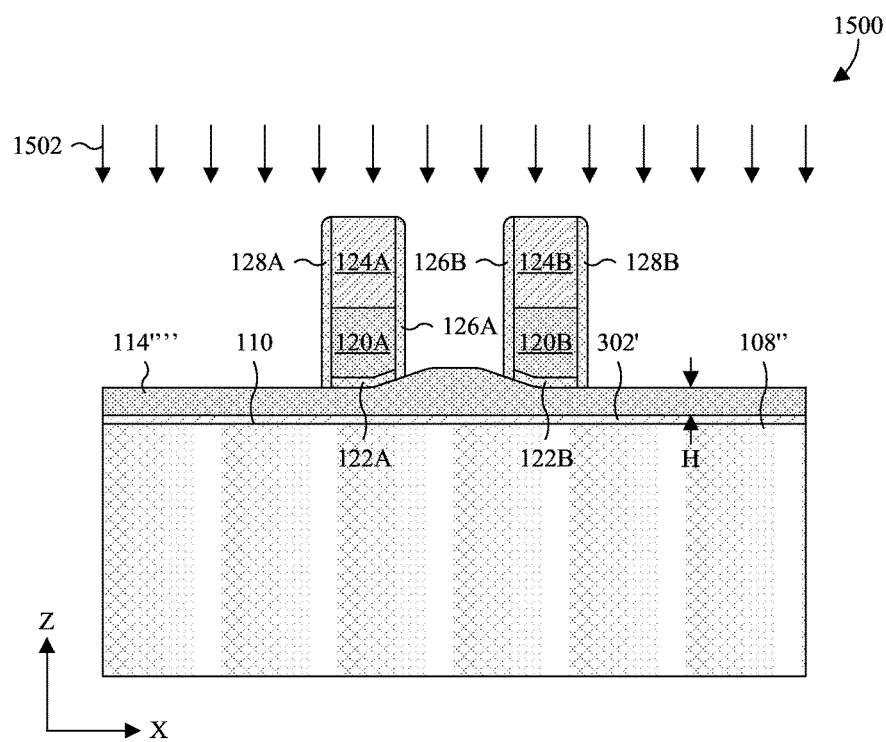

FIGS. 14 and 15 illustrate cross-sectional views 1400, 1500 of some embodiments corresponding to Act 214.

As illustrated by FIG. 14, a sidewall spacer layer 1402 is formed over the floating gate layer 114'''', and along outward facing surfaces of the hard masks 124A, 124B, the control gates 120A, 120B, and the control gate dielectric layers 122A, 122B. The sidewall spacer layer 1402 may be formed using CVD, or any other suitable deposition technique, and is typically formed conformally. The sidewall spacer layer 1402 may be, for example, formed as a multi-layer ONO film or an oxide.

As illustrated by FIG. 15, a seventh etch is performed into the sidewall spacer layer 1402 to etch back the sidewall spacer layer 1402 and to remove lateral stretches of the sidewall spacer layer 1402. The seventh etch results in common-side sidewall spacers 126A, 126B along neighboring sidewalls of the control gates 120A, 120B, as well as individual-side sidewall spacers 128A, 128B along sidewalls of the control gates 120A, 120B that oppose the neighboring sidewalls. The process for performing the seventh etch may include applying one or more etchants 1502 to the sidewall spacer layer 1402.

Figure 16:
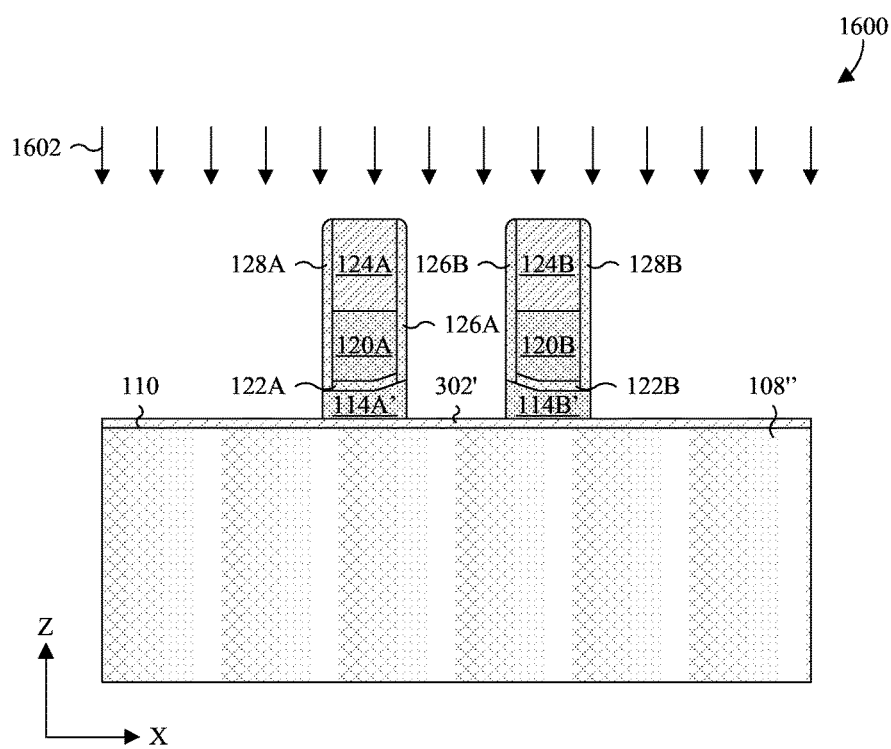

FIG. 16 illustrates a cross-sectional view 1600 of some embodiments corresponding to Act 216. As illustrated, an eighth etch is performed into the floating gate layer 114'''' (see FIG. 15), through regions of the floating gate layer 114'''' unmasked by the hard masks 124A, 124B and the sidewall spacers 126A, 126B, 128A, 128B. The eighth etch results in floating gates 114A', 114B' laterally spaced from one another. The process for performing the eighth etch may include applying an etchant 1602 to the floating gate layer 114''''. The etchant 1602 may be selective of the floating gate layer 114'''' relative to the first pad layer 302'.

Figure 17:
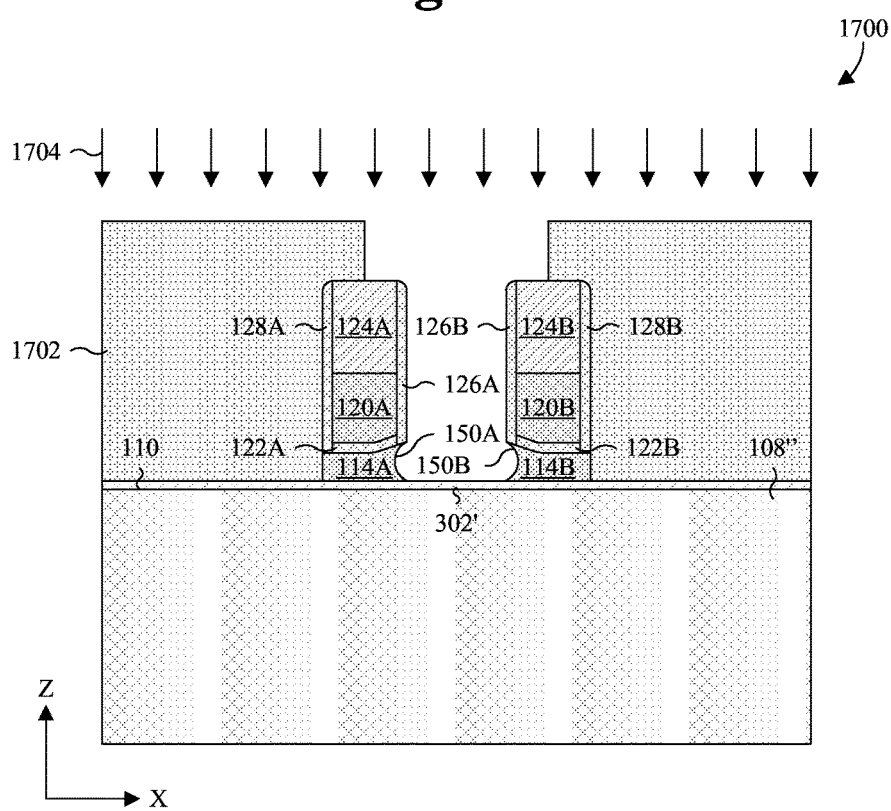

FIG. 17 illustrates a cross-sectional view 1700 of some embodiments corresponding to Act 218. As illustrated, a ninth etch is performed into the floating gates 114A', 114B' (see FIG. 16) to laterally etch neighboring sides of the floating gates 114A', 114B', while the sides of the floating gates 114A', 114B' opposing the neighboring sides are masked. The ninth etch defines concave sidewall surfaces 150A, 150B along the neighboring sides of the remaining floating gates 114A, 114B. The process for performing the ninth etch may include forming a third photoresist layer 1702 masking the sides of the floating gates 114A', 114B' opposing the neighboring sides of the floating gates 114A', 114B'. Further, an etchant 1704 may be applied to the floating gates 114A', 114B'. The etchant 1704 may include, for example, a dry etchant and/or a chemical dry etchant (CDE). Further, the etchant 1704 may be selective of the floating gates 114A', 114B' relative to the first pad layer 302'. Thereafter, the third photoresist layer 1702 may be removed.

Figure 18:
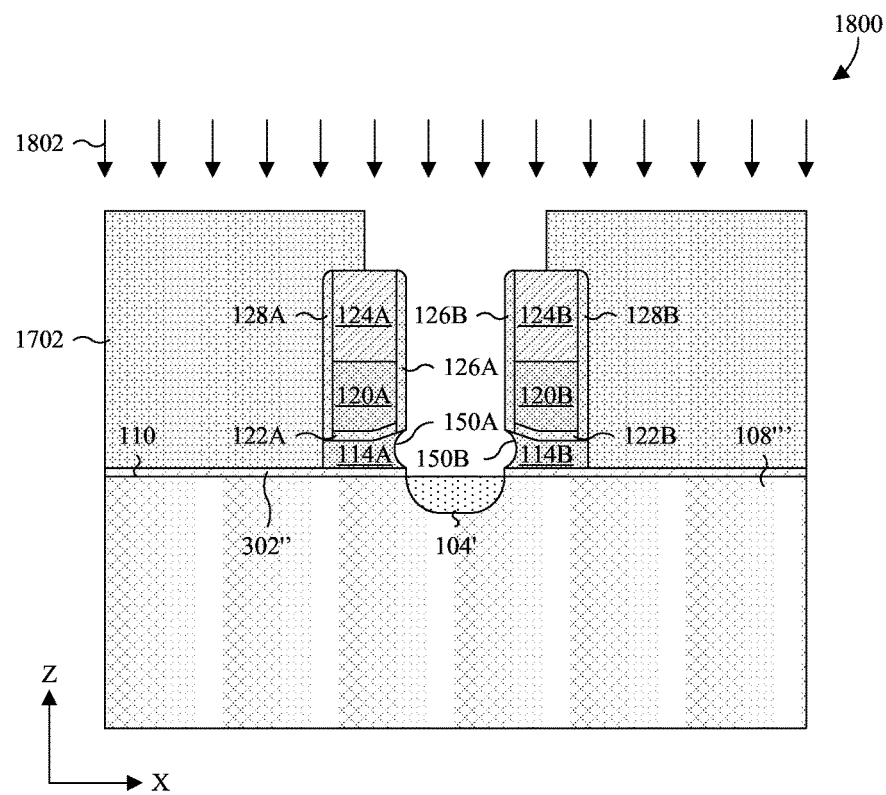

FIG. 18 illustrates a cross-sectional view 1800 of some embodiments corresponding to Act 220.

As illustrated by FIG. 18, a tenth etch is performed into the first pad layer 302' (see FIG. 17) to remove a central region between the neighboring sides of the floating gates 114A, 114B, while leaving peripheral regions on the sides opposing the neighboring sidewalls. The tenth etch is performed by applying an etchant to the first pad layer 302', while the peripheral regions are masked. In some embodiments, the peripheral regions are masked by the third photoresist layer 1702 of the ninth etch. In such embodiments, the third photoresist layer 1702 is removed after the tenth etch.

Also illustrated by FIG. 18, ions 1802 are implanted into the semiconductor substrate 108'' (see FIG. 17) between the floating gates 114A, 114B. The ions 1802 may be p- or n-type dopants. The implantation results in a remaining semiconductor substrate 108''' with a common source/drain region 104' between the floating gates 114A, 114B.

Figure 19:
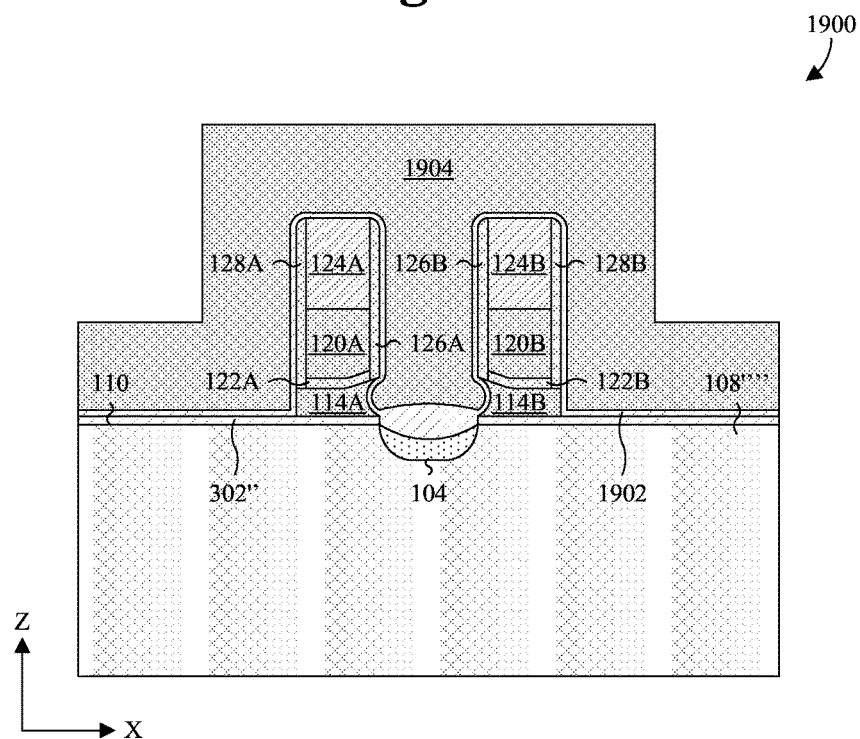
Figure 20:
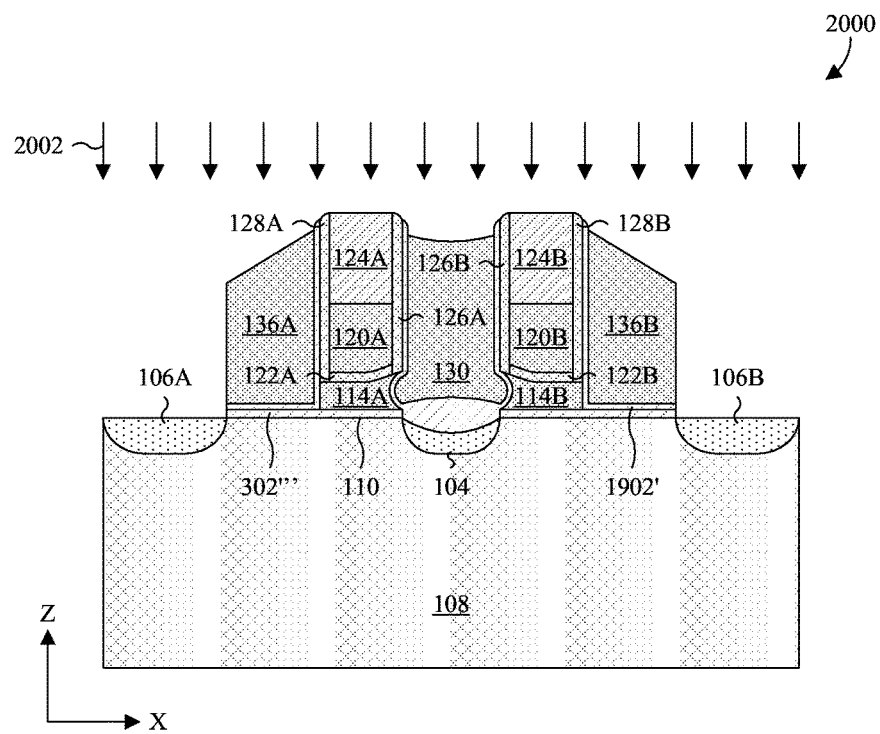

FIGS. 19 and 20 illustrate cross-sectional views 1900, 2000 of some embodiments corresponding to Act 222.

As illustrated by FIG. 19, a dielectric layer 1902 is formed over the first pad layer 302'', and lining exposed surfaces of the sidewall spacers 126A, 126B, 128A, 128B, the hard masks 124A, 124B, the floating gates 114A, 114B, and the semiconductor substrate 108''' (see FIG. 18). The dielectric layer 1902 may be formed using thermal oxidation, CVD, or any other suitable deposition technique, and is typically formed conformally. Further, the dielectric layer 1902 may be formed as, for example, an oxide, such as silicon dioxide. In some embodiments, the formation of the dielectric layer 1902 consumes part of the common source/drain region 104' (see FIG. 18) and the semiconductor substrate 108''', such as the remaining semiconductor substrate 108'''' is left with a smaller common source/drain region 104.

Also illustrated by FIG. 19, a conductive layer 1904 is formed over the dielectric layer 1902. The conductive layer 1904 may be formed using CVD or any other suitable deposition technique, and is typically formed conformally. The conductive layer 1904 may be formed as, for example, doped polysilicon.

As illustrated by FIG. 20, an eleventh etch is performed into the conductive layer 1904 (see FIG. 19) to etch back the conductive layer 1904 and to remove lateral stretches of the conductive layer 1904. The eleventh etch results in an erase gate 130 between neighboring sides of the floating gates 114A, 114B, as well as word lines 136A, 136B along sides of the floating gates 114A, 114B opposing the neighboring sides. The erase gate 130 bulges at the bottom to fill the concave sidewall surfaces 150A, 150B. The process for performing the eleventh etch may include applying an etchant to the conductive layer 1904. The etchant may be selective of the conductive layer 1904 relative to dielectric layer 1902 (see FIG. 19).

Also illustrated by FIG. 20, a twelfth etch is performed into exposed regions of the first pad layer 302'' (see FIG. 19) and the dielectric layer 1902 (see FIG. 19) to remove these regions. After the twelfth etch, sidewall surfaces of the remaining first pad layer 302''' and the remaining dielectric 1902' are approximately even with outward facing sidewall surfaces of the word lines 136A, 136B, and regions of the semiconductor substrate 108'''' (see FIG. 19) laterally adjacent to the word lines 136A, 136B are exposed. The process for performing the twelfth etch may include applying one or more etchants to the first pad layer 302'' and the dielectric layer 1902'. The one or more etchants may be selective of the first pad layer 302'' and the dielectric layer 1902' relative to the semiconductor substrate 108''''.

Also illustrated by FIG. 20, ions 2002 are implanted into the semiconductor substrate 108'''' (see FIG. 19) laterally adjacent to the word lines 136A, 136B. The ions 2002 may be p- or n-type dopants. The implantation results in a remaining semiconductor substrate 108 with individual source/drain region 106A, 106B laterally adjacent to the word lines 136A, 136B.

Figure 21A:
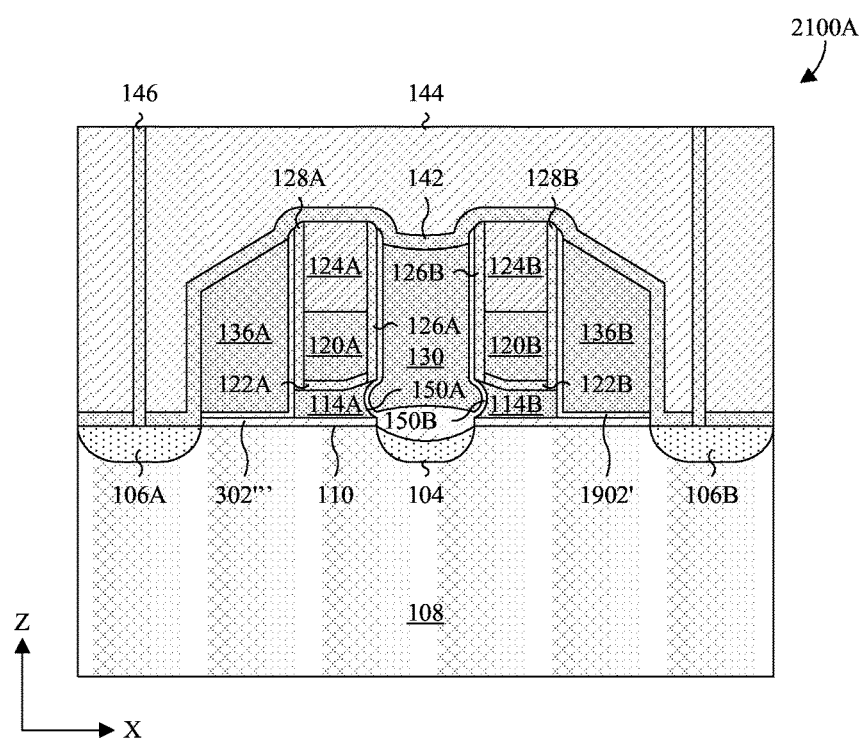
Figure 21B:
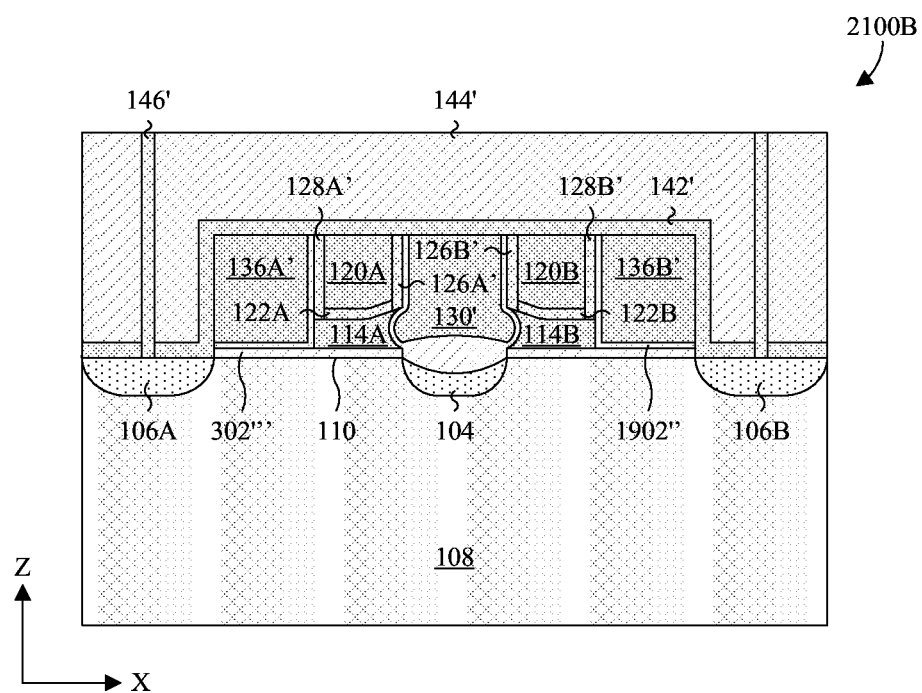

FIGS. 21A & 21B illustrate cross-sectional views 2100A, 2100B of alternative embodiments corresponding to Act 224.

As illustrated by FIG. 21A, a contact etch stop layer 142 is formed over the individual source/drain regions 106A, along exposed surfaces of the word lines 136A, 136B, the hard masks 124A, 124B, and the erase gates 130. The contact etch stop layer 142 may be formed using CVD or any other suitable deposition technique, and is typically formed conformally. The contact etch stop layer 142 may be formed as, for example, a nitride, such as silicon nitride.

Also illustrated by FIG. 21A, an ILD layer 144 is formed over the contact etch stop layer 142 with contacts 146 extending therethrough to one or more of the control gates 120A, 120B, the erase gate 130, the word lines 136A, 136B, and the individual source/drain regions 106A, 106B. The ILD layer 144 may be formed of an oxide or a low κ dielectric (i.e., a dielectric with a dielectric constant less than about 3.9). In some embodiments, the process for forming the ILD layer 144 includes forming an intermediate layer, and subsequently performing a CMP into the intermediate layer.

As illustrated by FIG. 21B, a CMP is performed into the word lines 136A, 136B (see FIG. 20), the hard masks 124A, 124B (see FIG. 20), the sidewall spacers 126A, 126B, 128A, 128B (see FIG. 20), the dielectric layer 1902' (see FIG. 20), and the erase gate 130 (see FIG. 20) to remove the hard masks 124A, 124B. The CMP results in remaining word lines 136A', 136', remaining sidewall spacers 126A', 126B', 128A', 128B', a remaining dielectric layer 1902'', and a remaining erase gate 130' with approximately coplanar upper surfaces. The CMP is common of HKMG processes. Thereafter, a contact etch stop layer 142', an ILD layer 144', and contacts 146' are formed as described in connection with FIG. 21A.

Thus, as can be appreciated from above, the present disclosure provides a split-gate flash memory cell. An erase gate and a floating gate are laterally spaced over a semiconductor substrate. The floating gate has a height increasing towards the erase gate, a concave sidewall surface neighboring the erase gate, and a tip defined an interface of the concave sidewall surface and an upper surface of the floating gate. A control gate and a sidewall spacer are arranged over the upper surface of the floating gate. The control gate is laterally offset from the tip of the floating gate, and the sidewall spacer is laterally arranged between the control gate and the tip.

In other embodiments, the present disclosure provides a method for manufacturing a split-gate flash memory cell. A pair of floating gates is formed on opposing sides of a shared source/drain region disposed within a semiconductor substrate, and with heights increasing towards the shared source/drain region. An erase gate is formed that is vertically separated from the shared source/drain region by an erase gate dielectric layer and that is laterally separated from the pair of floating gates by a tunneling dielectric layer. Control gates are formed that are vertically separated from the pair of floating gates by a control gate dielectric layer overlying the pair of floating gates. The pair of floating gates respectively have a concave sidewall surface abutting the tunneling dielectric layer, which causes a tip to protrude outward from the concave sidewall surface.

In yet other embodiments, the present disclosure provides a split-gate flash memory cell. A shared source/drain region is disposed within a semiconductor substrate. An erase gate is disposed over the shared source/drain region. A floating gate is disposed over the semiconductor substrate and has a sidewall surface laterally separated from the erase gate by a tunneling dielectric layer. The floating gate has a tip that protrudes outward along the sidewall surface of the floating gate. A control gate is separated from the floating gate by a control gate dielectric layer overlying the floating gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A split-gate flash memory cell, comprising:
    an erase gate and a floating gate laterally spaced over a semiconductor substrate, wherein the floating gate has a height increasing towards the erase gate, a concave sidewall surface neighboring the erase gate, a tip defined at an interface of the concave sidewall surface and an upper surface of the floating gate, and an additional sidewall surface on an opposite side of the floating gate as the concave sidewall surface, wherein the concave sidewall surface has a midpoint between a top edge of the concave sidewall surface and a bottom edge of the concave sidewall surface, wherein the top and bottom edges are farther from the additional sidewall surface than the midpoint is, wherein the erase gate has a width-wise bulge at a bottom of the erase gate, wherein the erase gate has a substantially uniform width from a top of the erase gate to a top of the width-wise bulge, and wherein the erase gate has a variable width greater than or equal to the substantially uniform width from the top of the width-wise bulge to a bottom of the erase gate; and
    a control gate and a sidewall spacer arranged over the upper surface of the floating gate, wherein the control gate is laterally offset from the tip of the floating gate, and wherein the sidewall spacer is laterally arranged between the control gate and the tip.

2. The split-gate flash memory cell according to claim 1, wherein the height of the floating gate is substantially uniform from the additional sidewall surface to a point laterally offset from the additional sidewall surface, and wherein the height of the floating gate increases from the point to the tip.

3. The split-gate flash memory cell according to claim 1, wherein the additional sidewall surface is substantially planar.

4. The split-gate flash memory cell according to claim 1, wherein the floating gate has an asymmetric profile along an axis bisecting the upper surface of the floating gate.

5. The split-gate flash memory cell according to claim 1, further comprising:
    a tunneling dielectric layer arranged between the erase gate and the floating gate, and between the erase gate and the sidewall spacer.

6. The split-gate flash memory cell according to claim 5, wherein the tunneling dielectric layer abuts neighboring sidewall surfaces of the erase gate and the floating gate, and abuts neighboring sidewall surfaces of the erase gate and the sidewall spacer.

7. The split-gate flash memory cell according to claim 1, further comprising:
    a word line arranged over the semiconductor substrate, laterally adjacent to the floating gate and the control gate.

8. A split-gate flash memory cell, comprising:
    a shared source/drain region disposed within a semiconductor substrate;
    an erase gate disposed over the shared source/drain region, wherein the erase gate comprises a pair of convex sidewalls respectively on opposite sides of the erase gate, and further comprises a pair of additional sidewalls respectively on the opposite sides, wherein the additional sidewalls have line-shaped profiles and extend from a top of the erase gate respectively to the convex sidewalls, and wherein the additional sidewalls are laterally between bottom edges respectively of the convex sidewalls;
    a floating gate disposed over the semiconductor substrate and having a sidewall surface laterally separated from the erase gate by a tunneling dielectric layer, wherein the floating gate has a tip that protrudes outward along the sidewall surface of the floating gate, and wherein the floating gate has another sidewall surface on an opposite side of the floating gate as the sidewall surface; and
    a control gate separated from the floating gate by a control gate dielectric layer overlying the floating gate;
    wherein the sidewall surface arcs continuously from a top edge of the sidewall surface to a bottom edge of the sidewall surface, and wherein the sidewall surface has a point laterally spaced between the other sidewall surface and the bottom edge.

9. The split-gate flash memory cell according to claim 8, wherein a width of the erase gate bulges below the tip.

10. The split-gate flash memory cell according to claim 8, further comprising:
    a pair of sidewall spacers arranged over and partially covering the floating gate, wherein the control gate is arranged between the sidewall spacers.

11. The split-gate flash memory cell according to claim 10, wherein the control gate dielectric layer is arranged between the sidewall spacers and comprises a pair of sidewall surfaces respectfully contacting the sidewall spacers.

12. The split-gate flash memory cell according to claim 10, wherein a bottom surface of one of the sidewall spacers is higher than a bottom surface of another one of the sidewall spacers with respect to the semiconductor substrate.

13. The split-gate flash memory cell according to claim 10, wherein one of the sidewall spacers has a sidewall surface that is adjacent to the sidewall surface of the floating gate, and wherein the tunneling dielectric layer conformally lines the sidewall surface of the one of the sidewall spacers and the sidewall surface of the floating gate while contacting the erase gate.

14. A split-gate flash memory cell comprising:
a semiconductor substrate comprising a first source/drain region and a second source/drain region;
an erase gate directly over the second source/drain region, wherein the erase gate bulges along a bottom of the erase gate;
a word line and a floating gate laterally spaced between the erase gate and the first source/drain region, wherein the floating gate comprises a first sidewall surface and a second sidewall surface respectively on opposite sides of the floating gate, wherein the second sidewall surface of the floating gate neighbors the erase gate and is concave, and wherein a height of the floating gate increases laterally from the first sidewall surface of the floating gate to the second sidewall surface of the floating gate; and
a control gate over the floating gate, wherein a height of the control gate decreases laterally from the first sidewall surface of the floating gate to the second sidewall surface of the floating gate;
wherein the erase gate protrudes into the floating gate to a point spaced from and between the first sidewall surface and a bottom edge of the second sidewall surface, wherein the point is defined by a conductive sidewall surface of the erase gate, and wherein the first and second sidewall surfaces of the floating gate are conductive.

15. The split-gate flash memory cell according to claim 14, wherein the height of the floating gate is substantially uniform from the first sidewall surface of the floating gate to a location laterally spaced between the first and second sidewall surfaces of the floating gate, and wherein the height of the floating gate increases continuously from the location to the second sidewall surface of the floating gate.

16. The split-gate flash memory cell according to claim 15, wherein the second sidewall surface arcs towards an interior of the floating gate, wherein the second sidewall surface is partially covered by a sidewall spacer that is between the control gate and the erase gate, and wherein a tunneling dielectric layer conformally lines the sidewall spacer and the second sidewall surface of the floating gate.

17. The split-gate flash memory cell according to claim 1, wherein the concave sidewall surface defines a lateral recess in the floating gate, and wherein the lateral recess has a bowl-shaped profile.

18. The split-gate flash memory cell according to claim 1, wherein the variable width increases continuously from the top of the width-wise bulge to about even with the midpoint of the concave sidewall surface.

19. The split-gate flash memory cell according to claim 14, wherein the split-gate flash memory cell further comprises:
a pair of shallow trench isolation (STI) structures, wherein the STI structures are laterally elongated in parallel and in a first direction, wherein a height of the floating gate increases from the first sidewall surface to the second sidewall surface in the first direction, wherein the floating gate is sandwiched between and adjoins the STI structures in a second direction transverse to the first direction, and wherein a top surface of the STI structure is recessed below a top surface of the floating gate.

20. The split-gate flash memory cell according to claim 14, wherein the erase gate comprises a pair of bulbous protrusions at a bottom of the erase gate, and further comprises a pair of erase gate sidewalls, wherein the bulbous protrusions are respectively on opposite sides of the erase gate, wherein the erase gate sidewalls are respectively on the opposite sides of the erase gate, wherein the erase gate sidewalls have substantially line-shaped profiles and extend from a top of the erase gate respectively to the bulbous protrusions, and wherein the bulbous protrusions protrude sideways respectively beginning at the erase gate sidewalls.

* * * * *